United States Patent
Cheng et al.

(10) Patent No.: US 9,944,768 B2
(45) Date of Patent: Apr. 17, 2018

(54) HIGH MODULUS LASER DIRECT STRUCTURING POLYCARBONATE COMPOSITES WITH ENHANCED PLATING PERFORMANCE AND BROAD LASER WINDOW AND METHODS FOR THE MANUFACTURE AND USE THEREOF

(71) Applicant: SABIC Global Technologies B.V., Bergen op Zoom (NL)

(72) Inventors: Yunan Cheng, Shanghai (CN); Xiaofeng Yu, Shanghai (CN); Yuxian An, Shanghai (CN)

(73) Assignee: SABIC GLOBAL TECHNOLOGIES B.V., Bergen op Zoom (NL)

( * ) Notice: Subject to any disclaimer, the term of this patent is extended or adjusted under 35 U.S.C. 154(b) by 0 days.

(21) Appl. No.: 14/227,271

(22) Filed: Mar. 27, 2014

(65) Prior Publication Data
US 2014/0296410 A1 Oct. 2, 2014

Related U.S. Application Data

(60) Provisional application No. 61/807,242, filed on Apr. 1, 2013.

(51) Int. Cl.
*H01B 3/42* (2006.01)
*H01B 3/30* (2006.01)
*H01B 3/47* (2006.01)
*C08K 3/22* (2006.01)
*C08K 3/04* (2006.01)
*C08K 3/34* (2006.01)
*C08K 3/40* (2006.01)
*C08L 69/00* (2006.01)
*H05K 1/03* (2006.01)
*H05K 3/18* (2006.01)
*C08K 3/32* (2006.01)
*C08K 7/14* (2006.01)
*C08K 3/24* (2006.01)

(52) U.S. Cl.
CPC ............ *C08K 3/22* (2013.01); *C08K 3/04* (2013.01); *C08K 3/24* (2013.01); *C08K 3/32* (2013.01); *C08K 3/34* (2013.01); *C08K 7/14* (2013.01); *C08L 69/00* (2013.01); *H01B 3/305* (2013.01); *H01B 3/426* (2013.01); *H01B 3/47* (2013.01); *H05K 1/0373* (2013.01); *H05K 3/185* (2013.01); *C08K 2003/2251* (2013.01); *C08K 2003/328* (2013.01); *H05K 2201/0236* (2013.01); *H05K 2201/09118* (2013.01); *H05K 2203/107* (2013.01)

(58) Field of Classification Search
USPC ................. 524/413, 451, 494–496
See application file for complete search history.

(56) References Cited

U.S. PATENT DOCUMENTS

| 4,746,701 | A | 5/1988 | Kress et al. |
| 7,553,895 | B2 * | 6/2009 | An ................ C08L 69/00 524/162 |
| 7,786,246 | B2 | 8/2010 | Jansen et al. |
| 8,017,697 | B2 | 9/2011 | Carrillo et al. |
| 2009/0088514 | A1 * | 4/2009 | Shiping ............ C08L 69/00 524/451 |
| 2009/0292048 | A1 * | 11/2009 | Li et al. ................ 524/115 |
| 2010/0152344 | A1 * | 6/2010 | van den Bogerd et al. .. 524/141 |
| 2012/0276390 | A1 * | 11/2012 | Ji ...................... H05K 3/185 428/412 |
| 2013/0313493 | A1 * | 11/2013 | Wen et al. ............. 252/601 |
| 2013/0317144 | A1 * | 11/2013 | Wu .................... C08K 3/22 524/116 |
| 2013/0317145 | A1 * | 11/2013 | An et al. .............. 524/116 |
| 2014/0076616 | A1 * | 3/2014 | Meng et al. .......... 174/255 |

FOREIGN PATENT DOCUMENTS

| CN | 102066122 A | 5/2011 |
| CN | 102071423 A | 5/2011 |
| EP | 2335936 A1 | 6/2011 |
| WO | 2012056385 A1 | 5/2012 |
| WO | 2012056416 A1 | 5/2012 |
| WO | 2013175451 A1 | 11/2013 |

OTHER PUBLICATIONS

Lyu et al. "Study of Mechanical and Rheological Behaviors of Linear and Branched Polycarbonates Blends", Journal of Applied Polymer Science, 80, pp. 1814-1824, Jun. 2001.*
Schartel et al., "Synergistic Use of Talc in Halogen-Free Flame Retarded Polycarbonate/Acrylonitrile-Butadiene-Styrene Blends", ACS Symposium Series, Chapter 2, Dec. 18, 2012.*
Ex parte Andre Appeal 2014-006692, Jun. 2016.*

* cited by examiner

*Primary Examiner* — Christopher M Rodd
(74) *Attorney, Agent, or Firm* — Baker Hostetler LLP

(57) ABSTRACT

The present disclosure relates to a polymer composition. The disclosed composition comprises a polycarbonate polymer, a laser direct structuring additive capable of being activated by electromagnetic radiation and thereby forming elemental metal nuclei, reinforcing filler, and a laser direct structuring synergist. Also disclosed is a method for making the disclosed polymer composition and an article of manufacture comprising the disclosed polymer composition.

29 Claims, 4 Drawing Sheets

HIGH MODULUS LASER DIRECT STRUCTURING POLYCARBONATE COMPOSITES WITH ENHANCED PLATING PERFORMANCE AND BROAD LASER WINDOW AND METHODS FOR THE MANUFACTURE AND USE THEREOF

CROSS REFERENCE TO RELATED PATENT APPLICATION

This application claims priority to U.S. Patent Application No. 61/807,242 filed Apr. 1, 2013, which is hereby incorporated herein by reference in its entirety.

BACKGROUND OF THE INVENTION

Electrical components can be provided as molded injection devices (MID) with desired printed conductors. In contrast to conventional circuit boards made of fiberglass-reinforced plastic or the like, MID components manufactured in this way are three-dimensional (3D) molded parts having an integrated printed conductor layout and possibly further electronic or electromechanical components. The use of MID components of this type, even if the components have only printed conductors and are used to replace conventional wiring inside an electrical or electronic device, saves space, allowing the relevant device to be made smaller. It also lowers the manufacturing costs by reducing the number of assembly and contacting steps. These MID devices have great utility in cell phones, PDAs and notebook applications.

Stamp metal, flexible printed circuit board (FPCB) mounted, and two-shot molding methods are three existing technologies to make an MID. However, stamping and FPCB mounted process have limitations in the pattern geometry, and the tooling is expensive. Also, altering a RF pattern can cause high-priced and time-consuming modifications in tooling. Two-shot-molding (two-component injection molding) processes have also been used to produce 3D-MIDs with real three-dimensional structures. For example, an antenna can be formed by subsequent chemical corrosion, chemical surface activation, and selective metal coating. This method involves relatively high initial costs and is only economically viable for large production numbers. Two-shot-molding is also not regarded as an environmentally friendly process. All of these three methods are tool-based technologies, which have limited flexibility, long development cycles, difficult prototype, expensive design changes, and limited ability to produce miniaturization. Accordingly, it is becoming increasingly popular to form MIDs using a new laser direct structuring (LDS) process. In an LDS process a computer-controlled laser beam travels over the MID to activate the plastic surface at locations where the conductive path is to be situated.

Laser-supported or directed structuring process (LDS) for 3D MIDs simplifies the manufacturing process. For example, the LDS process allows for antenna structures to be directly and cost effectively integrated into the cell phone housing. Further, the LDS process allows for sophisticated mechatronic systems that integrate mechanical and electrical properties for automotive and medical applications. With a laser direct structuring process, it is also possible to obtain small conductive path widths (such as 150 microns or less). In addition, the spacing between the conductive paths can also be small. As a result, MIDs formed from this process can save space and weight in end-use applications. Another advantage of laser direct structuring is its flexibility. If the design of the circuit is to be changed, it is simply a matter of reprogramming the computer that controls the laser.

In a conventional LDS process, a polymer composition can be doped with a metal containing LDS additive such that it can be activated by a laser. The laser beam can then be used to activate the LDS additive forming a micro-rough track on the surface. The metal particles from the LDS additive present on the surface of the micro-rough track can in turn form nuclei for the subsequent metallization. However, due to different chemical plating solutions and conditions used, the plating performance of conventional LDS materials can vary in ways such as plating rate and adhesion of plating layers.

Accordingly, it would be beneficial to provide a LDS blended polymer composition having good plating performance while maintaining good mechanical performance. Further, it would be beneficial to provide a LDS blended polymer composition having good plating performance for a broad window of laser parameters, high plating index values, or low plating index values variance. This and other needs are satisfied by the various aspects of the present disclosure.

SUMMARY OF THE INVENTION

In accordance with the purpose of the invention, as embodied and broadly described herein, the invention, in one aspect, relates to a polymer composition comprising:
  a. a polycarbonate polymer;
  b. a laser direct structuring additive capable of being activated by an electromagnetic radiation and thereby forming elemental metal nuclei;
  c. a reinforcing filler; and
  d. a laser direct structuring synergist, wherein the laser direct structuring synergist does not comprise a substantially linear polycarbonate polymer; and
  wherein the polymer composition is capable of being plated after being activated using a laser.

Also disclosed is a method for making a polycarbonate composition, comprising forming a blend composition comprising:
  a. a polycarbonate polymer;
  b. a laser direct structuring additive capable of being activated by electromagnetic radiation and thereby forming elemental metal nuclei;
  c. a reinforcing filler; and
  d. a laser direct structuring synergist wherein the laser direct structuring synergist does not comprise a substantially linear polycarbonate polymer; and
  wherein the polymer composition is capable of being plated after being activated using a laser.

Also disclosed is an article molded from a polymer composition comprising:
  a. a polycarbonate polymer;
  b. a laser direct structuring additive capable of being activated by electromagnetic radiation and thereby forming elemental metal nuclei;
  c. a reinforcing filler; and
  d. a laser direct structuring synergist wherein the laser direct structuring synergist does not comprise a substantially linear polycarbonate polymer; and
  wherein the polymer composition is capable of being plated after being activated using a laser.

While aspects of the present invention can be described and claimed in a particular statutory class, such as the system statutory class, this is for convenience only and one of skill in the art will understand that each aspect of the present invention can be described and claimed in any statutory class. Unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

Other advantages will be set forth in part in the description which follows or may be learned by practice. The advantages will be realized and attained by means of the elements and combinations particularly pointed in the appended claims. It is to be understood that both the foregoing general description and the following detailed description are exemplary and explanatory only and are not restrictive, as claimed.

BRIEF DESCRIPTION OF THE DRAWINGS

The accompanying drawings, which are incorporated in and constitute a part of this specification, illustrate exemplary aspects and together with the description, serve to explain the principles of the compositions, methods and systems disclosed herein.

DETAILED DESCRIPTION OF THE INVENTION

Figure 1:
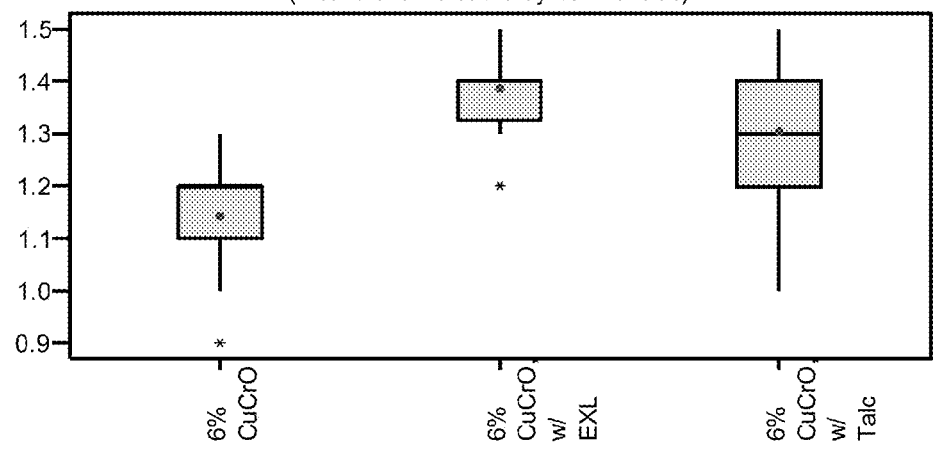
FIG. 1 shows the representative plating index values measured for representative disclosed LDS polycarbonate composites, with and without a laser direct structuring synergist, wherein the representative laser direct structuring synergists are polysiloxane-polycarbonate copolymer (EXL) and Talc. Solid circles indicate the mean plating index values.

The present invention relates to conductive thermoplastic resin compositions The present invention can be understood more readily by reference to the following detailed description, examples, drawings, and claims, and their previous and following description. However, before the present compositions, articles, devices, systems, and/or methods are disclosed and described, it is to be understood that this invention is not limited to the specific compositions, articles, devices, systems, and/or methods disclosed unless otherwise specified, as such can, of course, vary. It is also to be understood that the terminology used herein is for the purpose of describing particular aspects only and is not intended to be limiting.

The following description of the invention is also provided as an enabling teaching of the invention in its best, currently known aspect. To this end, those of ordinary skill in the relevant art will recognize and appreciate that changes and modifications can be made to the various aspects of the invention described herein, while still obtaining the beneficial results of the present invention. It will also be apparent that some of the desired benefits of the present invention can be obtained by selecting some of the features of the present invention without utilizing other features. Accordingly, those of ordinary skill in the relevant art will recognize that many modifications and adaptations to the present invention are possible and can even be desirable in certain circumstances and are thus also a part of the present invention. Thus, the following description is provided as illustrative of the principles of the present invention and not in limitation thereof.

Various combinations of elements of this disclosure are encompassed by this invention, e.g. combinations of elements from dependent claims that depend upon the same independent claim.

Moreover, it is to be understood that unless otherwise expressly stated, it is in no way intended that any method set forth herein be construed as requiring that its steps be performed in a specific order. Accordingly, where a method claim does not actually recite an an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; and the number or type of aspects described in the specification.

All publications mentioned herein are incorporated herein by reference to disclose and describe the methods and/or materials in connection with which the publications are cited.

It is also to be understood that the terminology used herein is for the purpose of describing particular aspects only and is not intended to be limiting. As used in the specification and in the claims, the term "comprising" may include the aspects "consisting of" and "consisting essentially of" Unless defined otherwise, all technical and scientific terms used herein have the same meaning as commonly understood by one of ordinary skill in the art to which this invention belongs. In this specification and in the claims which follow, reference will be made to a number of terms which shall be defined herein.

As used in the specification and the appended claims, the singular forms "a," "an" and "the" include plural referents unless the context clearly dictates otherwise. Thus, for example, reference to "a polycarbonate" includes mixtures of two or more such polycarbonates. Furthermore, for example, reference to a filler includes mixtures of two or more such fillers.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

As used herein, the terms "optional" or "optionally" mean that the subsequently described event, condition, component, or circumstance may or may not occur, and that the description includes instances where said event or circumstance occurs and instances where it does not.

As used herein, the term or phrase "effective," "effective amount," or "conditions effective to" refers to such amount or condition that is capable of performing the function or property for which an effective amount is expressed. As will be pointed out below, the exact amount or particular condition required will vary from one aspect to another, depending on recognized variables such as the materials employed and the processing conditions observed. Thus, it is not always possible to specify an exact "effective amount" or "condition effective to." However, it should be understood that an appropriate effective amount will be readily determined by one of ordinary skill in the art using only routine experimentation.

Disclosed are component materials to be used to prepare disclosed compositions of the invention as well as the compositions themselves to be used within methods disclosed herein. These and other materials are disclosed herein, and it is understood that when combinations, subsets, interactions, groups, etc. of these materials are disclosed that while specific reference of each various individual and collective combinations and permutation of these compounds cannot be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a a class of molecules D, E, and F and an example of a combination molecule, A-D is then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions of the invention. Thus, if there are a variety of additional steps that can be performed it is understood that each of these additional steps can be performed with any specific aspect or combination of aspects of the methods of the invention.

References in the specification and concluding claims to parts by weight, of a particular element or component in a composition or article denotes the weight relationship between the element or component and any other elements or components in the composition or article for which a part by weight is expressed. Thus, in a composition containing 2 parts by weight of component X and 5 parts by weight component Y, X and Y are present at a weight ratio of 2:5, and are present in such ratio regardless of whether additional components are contained in the compound.

A weight percent of a component, unless specifically stated to the contrary, is based on the total weight of the formulation or composition in which the component is included. For example if a particular element or component in a composition or article is said to have 8% weight, it is understood that this percentage is relation to a total compositional percentage of 100%.

Compounds disclosed herein are described using standard nomenclature. For example, any position not substituted by any indicated group is understood to have its valency filled by a bond as indicated, or a hydrogen atom. A dash ("-") that is not between two letters or symbols is used to indicate a point of attachment for a substituent. For example, —CHO is attached through carbon of the carbonyl group. Unless defined otherwise, technical and scientific terms used herein have the same meaning as is commonly understood by one of skill in the art to which this invention belongs.

The term "alkyl group" as used herein is a branched or unbranched saturated hydrocarbon group of 1 to 24 carbon atoms, such as methyl, ethyl, n-propyl, isopropyl, n-butyl, isobutyl, t-butyl, pentyl, hexyl, heptyl, octyl, decyl, tetradecyl, hexadecyl, eicosyl, tetracosyl and the like. A "lower alkyl" group is an alkyl group containing from one to six carbon atoms.

The term "alkoxy" as used herein is an alkyl group bound through a single, terminal ether linkage; that is, an "alkoxy" group can be defined as —OR where R is alkyl as defined above. A "lower alkoxy" group is an alkoxy group containing from one to six carbon atoms.

The term "alkenyl group" as used herein is a hydrocarbon group of from 2 to 24 carbon atoms and structural formula containing at least one carbon-carbon double bond. Asymmetric structures such as (AB)C=C(CD) are intended to include both the E and Z isomers. This can be presumed in structural formulae herein wherein an asymmetric alkene is present, or it can be explicitly indicated by the bond symbol C.

The term "alkynyl group" as used herein is a hydrocarbon group of 2 to 24 carbon atoms and a structural formula containing at least one carbon-carbon triple bond.

The term "aryl group" as used herein is any carbon-based aromatic group including, but not limited to, benzene, naphthalene, etc. The term "aromatic" also includes "heteroaryl group," which is defined as an aromatic group that has at least one heteroatom incorporated within the ring of the aromatic group. Examples of heteroatoms include, but are not limited to, nitrogen, oxygen, sulfur, and phosphorus. The aryl group can be substituted or unsubstituted. The aryl group can be substituted with one or more groups including, but not limited to, alkyl, alkynyl, alkenyl, aryl, halide, nitro, amino, ester, ketone, aldehyde, hydroxy, carboxylic acid, or alkoxy.

The term "cycloalkyl group" as used herein is a non-aromatic carbon-based ring composed of at least three carbon atoms. Examples of cycloalkyl groups include, but are not limited to, cyclopropyl, cyclobutyl, cyclopentyl, cyclohexyl, etc. The term "heterocycloalkyl group" is a cycloalkyl group as defined above where at least one of the carbon atoms of the ring is substituted with a heteroatom such as, but not limited to, nitrogen, oxygen, sulphur, or phosphorus.

The term "aralkyl" as used herein is an aryl group having an alkyl, alkynyl, or alkenyl group as defined above attached to the aromatic group. An example of an aralkyl group is a benzyl group.

The term "hydroxyalkyl group" as used herein is an alkyl, alkenyl, alkynyl, aryl, aralkyl, cycloalkyl, halogenated alkyl, or heterocycloalkyl group described above that has at least one hydrogen atom substituted with a hydroxyl group.

The term "alkoxyalkyl group" is defined as an alkyl, alkenyl, alkynyl, aryl, aralkyl, cycloalkyl, halogenated alkyl, or heterocycloalkyl group described above that has at least one hydrogen atom substituted with an alkoxy group described above.

The term "ester" as used herein is represented by the formula —C(O)OA, where A can be an alkyl, halogenated alkyl, alkenyl, alkynyl, aryl, heteroaryl, cycloalkyl, cycloalkenyl, heterocycloalkyl, or heterocycloalkenyl group described above.

The term "carbonate group" as used herein is represented by the formula —OC(O)OR, where R can be hydrogen, an alkyl, alkenyl, alkynyl, aryl, aralkyl, cycloalkyl, halogenated alkyl, or heterocycloalkyl group described above.

The term "carboxylic acid" as used herein is represented by the formula —C(O)OH.

The term "aldehyde" as used herein is represented by the formula —C(O)H.

The term "keto group" as used herein is represented by the formula —C(O)R, where R is an alkyl, alkenyl, alkynyl, aryl, aralkyl, cycloalkyl, halogenated alkyl, or heterocycloalkyl group described above.

The term "carbonyl group" as used herein is represented by the formula C=O.

The term "ether" as used herein is represented by the formula $AOA^1$, where A and $A^1$ can be, independently, an alkyl, halogenated alkyl, alkenyl, alkynyl, aryl, heteroaryl, cycloalkyl, cycloalkenyl, heterocycloalkyl, or heterocycloalkenyl group described above.

The term "sulfo-oxo group" as used herein is represented by the formulas —S(O)$_2$R, —OS(O)$_2$R, or, —OS(O)$_2$OR, where R can be hydrogen, an alkyl, alkenyl, alkynyl, aryl, aralkyl, cycloalkyl, halogenated alkyl, or heterocycloalkyl group described above.

As used herein, the term "substantially identical reference composition" refers to a composition that is substantially identical to the inventive composition by consisting essentially of the same proportions and components but in the absence of a single component.

As used herein, the terms "number average molecular weight" or "Mn" can be used interchangeably, and refer to the statistical average molecular weight of all the polymer chains in the sample and is defined by the formula:

$$M_n = \frac{\sum N_i M_i}{\sum N_i},$$

where $M_i$ is the molecular weight of a chain and $N_i$ is the number of chains of that molecular weight. Mn can be determined for polymers, such as polycarbonate polymers or polycarbonate-PMMA copolymers, by methods well known to a person having ordinary skill in the art. It is to be understood that as used herein, Mn is measured gel permeation chromatography and as calibrated with polycarbonate standards. For example, gel permeation chromatography can be carried out using a crosslinked styrene-divinyl benzene column, at a sample concentration of 1 milligram per milliliter with appropriate mobile phase solvents.

As used herein, the terms "weight average molecular weight" or "Mw" can be used interchangeably, and are defined by the formula:

$$M_w = \frac{\sum N_i M_i^2}{\sum N_i M_i},$$

where $M_i$ is the molecular weight of a chain and $N_i$ is the number of chains of that molecular weight. Compared to Mn, Mw takes into account the molecular weight of a given chain in determining contributions to the molecular weight average. Thus, the greater the molecular weight of a given chain, the more the chain contributes to the Mw. It is to be understood that as used herein, Mw is measured gel permeation chromatography. In some cases, Mw is measured gel permeation chromatography and calibrated with polycarbonate standards. Gel permeation chromatography can be carried out using a crosslinked styrene-divinyl benzene column, at a sample concentration of about 1 milligram per milliliter with appropriate mobile phase solvents.

As used herein, the terms "polydispersity index" or "PDI" can be used interchangeably, and are defined by the formula:

$$PDI = \frac{M_w}{M_n}.$$

The PDI has a value equal to or greater than 1, but as the polymer chains approach uniform chain length, the PDI approaches unity.

As used herein, the terms "mean" or "statistical mean", can be used interchangeably, and are defined by the formula:

$$\bar{x} = \frac{1}{n} \cdot \sum_{i=1}^{n} x_i$$

Wherein $x_i$ is the measured value, and n is the number of values.

As used herein, the term "variance" refers to a numerical value that is used to indicate how widely the measured values in a group vary, and is defined by the formula:

$$\sigma^2 = \frac{\Sigma(x_i - \bar{x})^2}{n},$$

wherein $\sigma^2$ is a variance, $x_i$ is the measured value, $\bar{x}$ is the mean value, and n is the number values.

The terms "polycarbonate" or "polycarbonates" as used herein includes copolycarbonates, homopolycarbonates and (co)polyester carbonates.

The terms "residues" and "structural units", used in reference to the constituents of the polymers, are synonymous throughout the specification.

Each of the component materials disclosed herein are either commercially available and/or the methods for the production thereof are known to those of ordinary skill in the art.

It is understood that the compositions disclosed herein have certain functions. Disclosed herein are certain structural requirements for performing the disclosed functions, and it is understood that there are a variety of structures that can perform the same function that are related to the disclosed structures, and that these structures will typically achieve the same result.

I. Polymer Compositions

As summarized above, the disclosure provides an improved polymer composition that is particularly useful in connection with laser direct structuring (LDS) technology. For example, as described in greater detail below, aspects of the disclosure provide a polymer composition that is capable of being used in a laser direct structuring (LDS) process and that provide an enhanced plating performance while exhibiting relatively good mechanical properties. To that end, the disclosed polymer composition generally comprises a blend of a polycarbonate polymer component; a laser direct structuring additive; a reinforcing filler; and a laser direct structuring synergist, wherein the laser direct structuring synergist does not comprise substantially linear polycarbonate polymer; and wherein the polymer composition is capable of being metallized through plating process after being activated using a laser.

The disclosed polymer composition disclosed herein provides a robust plating performance while maintaining good mechanical properties. Robustness of plating performance can be measured via a performance ranking, or plating ranking, ranging from top performance (e.g., "best") to bottom performance. The ranking can be partitioned in various levels. In one aspect, a plating ranking can have a level of "10" for top performance and a level of "0" for bottom performance.

According to aspects of the disclosure, a molded article formed from the disclosed polymer composition can exhibit a notched Izod impact energy at 23° C. of at least about 70 J/m. In further aspects, a molded article formed from a disclosed polymer composition can exhibit a notched Izod impact energy at 23° C. in the range from about 75 J/m to about 165 J/m, including exemplary impact energy values of about 80 J/m, 85 J/m, 90 J/m, 95 J/m, 100 J/m, 105 J/m, 110 J/m, 115 J/m, 120 J/m, 125 J/m, 130 J/m, 135 J/m, 140 J/m, 145 J/m, 150 J/m, 155 J/m, and 160 J/m. In still further aspects, a molded article formed from a disclosed polymer composition can exhibit a notched Izod impact energy at 23° C. in any range derived from any two values set forth above. For example, a molded article formed from a polymer composition can exhibit a notched Izod impact energy at 23° C. in the range of from about 75 J/m to about 160 J/m.

According to aspects of the disclosure, a molded article formed from the disclosed polymer composition can exhibit a unnotched Izod impact energy at 23° C. of at least about 400 J/m. In further aspects, a molded article formed from a disclosed polymer composition can exhibit an unnotched Izod impact energy at 23° C. in the range from about 470 J/m to about 750 J/m, including exemplary impact energy values of about 480 J/m, 490 J/m, 500 J/m, 510 J/m, 520 J/m, 530 J/m, 540 J/m, 550 J/m, 560 J/m, 570 J/m, 580 J/m, 590 J/m, 600 J/m, 610 J/m, 620 J/m, 630 J/m, 640 J/m, 650 J/m, 660 J/m, 670 J/m, 680 J/m, 690 J/m, 700 J/m, 710 J/m, 720 J/m, 730 J/m, and 740 J/m. In still further aspects, a molded article formed from a disclosed polymer composition can exhibit an unnotched Izod impact energy at 23° C. in any range derived from any two values set forth above. For example, a molded article formed from a polymer composition can exhibit an unnotched Izod impact energy at 23° C. in the range of from about 500 J/m to about 550 J/m.

According to aspects of the disclosure, a molded article formed from the disclosed polymer composition can exhibit improved tensile modulus. In one aspect, the tensile modulus can be in the range of from about 1.0 GPa to about 10.0 GPa. In a further aspect of the disclosure, a molded article formed from the disclosed polymer composition exhibits tensile modulus of at least about 3 GPa. In yet another aspect, a molded article formed from the disclosed polymer composition exhibits tensile modulus least about 3 GPa to about 10 GPa, including exemplary values of about 3.1 GPa, 3.2 GPa, 3.3 GPa, 3.4 GPa, 3.5 GPa, 3.6 GPa, 3.7 GPa, 3.8 Gpa, 3.9 GPa, 4.0 GPa, 4.1 GPa, 4.2 GPa, 4.3 GPa, 4.4 GPa, 4.5 GPa, 4.6 GPa, 4.7 GPa, 4.8 GPa, 4.9 GPa, 5.0 GPa, 5.1 GPa, 5.2 GPa, 5.3 GPa, 5.4 GPa, 5.5 GPa, 5.6 GPa, 5.7 GPa, 5.8 GPa, 5.9 GPa, 6.0 GPa, 6.1 GPa, 6.2 GPa, 6.3 GPa, 6.4 GPa, 6.5 GPa, 6.6 GPa, 6.7 GPa, 6.8 GPa, 6.9 GPa, 7.0 GPa, 7.1 GPa, 7.2 GPa, 7.3 GPa, 7.4 GPa, 7.5 GPa, 7.6 GPa, 7.7 GPa, 7.8 GPa, 7.9 GPa, 8.0 GPa, 8.1 GPa, 8.2 GPa, 8.3 GPa, 8.4 GPa, 8.5 GPa, 8.6 GPa, 8.7 GPa, 8.8 GPa, 8.9 GPa, 9.0 GPa, 9.1 GPa, 9.2 GPa, 9.3 GPa, 9.4 GPa, 9.5 GPa, 9.6 GPa, 9.7 GPa, 9.8 GPa, and 9.9 GPa. In another aspect, the tensile modulus can be in any range derived from any two of the above tensile modulus values. For example, the tensile modulus can be in the range of from about 7.0 GPa to about 9.0 GPa. In a still further aspect, aspect, the tensile modulus can be in the range of from about 7.1 GPa to about 8.9 GPa.

According to aspects of the disclosure, a molded article formed from the disclosed polymer composition can exhibit improved tensile strength. For example, the tensile strength can be in the range of from about 85 MPa to about 115 MPa, including exemplary tensile strengths of about 86 MPa, 87 MPa, 88 MPa, 89 MPa, 90 MPa, 91 MPa, 92 MPa, 93 MPa, 94 MPa, 95 MPa, 96 MPa, 97 MPa, 98 MPa, 99 MPa, 100 MPa, 101 MPa, 102 MPa, 103 MPa, 104 MPa, 105 MPa, 106 MPa, 107 MPa, 108 MPa, 109 MPa, 110 MPa, 111 MPa, 112 MPa, 113 MPa and about 114 MPa. In a still further aspect, the tensile strength can be within any range of values derived from the above tensile strength values. For example, the tensile strength can be in the range of from about 90 MPa to about 115 MPa. In a further aspect, the tensile strength can be in the range of from about 90 MPa to about 110 MPa.

In still further aspects, a molded article formed from the disclosed polymer composition can exhibit desirable values of tensile elongation. For example, according to aspects, a molded article formed from the disclosed polymer composition can exhibit an elongation at break in the range of from about 1% to about 10%, including exemplary values of about 2%, 3%, 4%, 5%, 6%, 7%, 8%, and 9%. In a still further aspect, the tensile elongation can be in a range derived from any two of the above listed exemplary tensile elongations. For example, the tensile elongation can be in the range of from about 2% to about 5%. In a further aspect, the tensile elongation can be in the range of from about 1% to about 3%.

According to aspects of the disclosure, a molded article formed from the disclosed polymer composition can exhibit an improved flexural modulus. In one aspect, the flexural modulus can be in the range of from about 1.0 GPa to about 10.0 GPa. In a further aspect of the disclosure, a molded article formed from the disclosed polymer composition exhibits a flexural modulus of at least about 3 GPa. In yet another aspect, a molded article formed from the disclosed polymer composition exhibits a flexural modulus of at least about 3 GPa to about 10 GPa, including exemplary values of about 3.1 GPa, 3.2 GPa, 3.3 GPa, 3.4 GPa, 3.5 GPa, 3.6 GPa, 3.7 GPa, 3.8 Gpa, 3.9 GPa, 4.0 GPa, 4.1 GPa, 4.2 GPa, 4.3 GPa, 4.4 GPa, 4.5 GPa, 4.6 GPa, 4.7 GPa, 4.8 GPa, 4.9 GPa, 5.0 GPa, 5.1 GPa, 5.2 GPa, 5.3 GPa, 5.4 GPa, 5.5 GPa, 5.6 GPa, 5.7 GPa, 5.8 GPa, 5.9 GPa, 6.0 GPa, 6.1 GPa, 6.2 GPa, 6.3 GPa, 6.4 GPa, 6.5 GPa, 6.6 GPa, 6.7 GPa, 6.8 GPa, 6.9 GPa, 7.0 GPa, 7.1 GPa, 7.2 GPa, 7.3 GPa, 7.4 GPa, 7.5 GPa, 7.6 GPa, 7.7 GPa, 7.8 GPa, 7.9 GPa, 8.0 GPa, 8.1 GPa, 8.2 GPa, 8.3 GPa, 8.4 GPa, 8.5 GPa, 8.6 GPa, 8.7 GPa, 8.8 GPa, 8.9 GPa, 9.0 GPa, 9.1 GPa, 9.2 GPa, 9.3 GPa, 9.4 GPa, 9.5

GPa, 9.6 GPa, 9.7 GPa, 9.8 GPa, and 9.9 GPa. In another aspect, the flexural modulus can be in any range derived from any two of the above flexural modulus values. For example, the flexural modulus can be in the range of from about 7.0 GPa to about 9.0 GPa. In a still further aspect, the flexural modulus can be in the range of from about 7.1 GPa to about 8.9 GPa.

According to aspects of the disclosure, a molded article formed from the disclosed polymer composition can exhibit an improved flexural strength. For example, the flexural strength can be in the range of from about 130 MPa to about 180 MPa, including exemplary flexural strengths of 131 MPa, 132 MPa, 133 MPa, 134 MPa, 135 MPa, 136 MPa, 137 MPa, 138 MPa, 139 MPa, 140 MPa, 141 MPa, 142 MPa, 143 MPa, 144 MPa, 145 MPa, 146 MPa, 147 MPa, 148 MPa, and 149 MPa, 150 MPa, 151 MPa, 152 MPa, 153 MPa, 154 MPa, 155 MPa, 156 MPa, 157 MPa, 158 MPa, 159 MPa, 160 MPa, 161 MPa, 162 MPa, 163 MPa, 164 MPa, 165 MPa, 166 MPa, 167 MPa, 168 MPa, and 169 MPa, 170 MPa, 171 MPa, 172 MPa, 173 MPa, 174 MPa, 175 MPa, 176 MPa, 177 MPa, 178 MPa, and about 179 MPa. In still a further aspect, the flexural strength can be within any range of values derived from the above flexural strength values. For example, the tensile strength can be in the range of from about 135 MPa to about 180 MPa. In another aspect, the flexural strength can be in the range of from about 135 MPa to about 179 MPa.

In still further aspects, a molded article formed from the disclosed polymer composition can exhibit desirable heat deflection temperatures (HDT). For example, a molded article formed from a disclosed polymer composition can exhibit a heat deflection temperature in the range of from about 120 to about 140° C. In another aspect, a molded article formed from a disclosed polymer composition can exhibit a heat deflection temperature in the range of from about 125 to about 140° C., including exemplary deflection temperature of about 126° C., 127° C., 128° C., 129° C., 130° C., 132° C., 132° C., or 133° C., 134° C., 135° C., 136° C., 137° C., 138° C., or about 139° C.

In yet further aspects, a molded article formed from the disclosed polymer composition can exhibit desirable values of melt flow rate (MFR) (measure at 300° C., 1.2 kg, 360 s). For example, according to aspects, a molded article formed from the disclosed polymer composition can exhibit an MFR in the range from about 9 cm$^3$/10 min to about 25 cm$^3$/10 min, including exemplary values of about 10 cm$^3$/10 min, 11 cm$^3$/10 min, 12 cm$^3$/10 min, 13 cm$^3$/10 min, 14 cm$^3$/10 min, 15 cm$^3$/10 min, 16 cm$^3$/10 min, 17 cm$^3$/10 min, 18 cm$^3$/10 min, 19 cm$^3$/10 min, 20 cm$^3$/10 min, 21 cm$^3$/10 min, 22 cm$^3$/10 min, 23 cm$^3$/10 min, and about 24 cm$^3$/10 min. In still further aspects, the MFR can be in the range derived from any two of the above listed exemplary MFR values. For example, the MFR can be in the range of from about 9.5 cm$^3$/10 min to about 23 cm$^3$/10 min.

In still further aspects, a molded article formed from the disclosed polymer composition is capable of having an enhanced plating efficiency in a broad window of the laser parameters. In another aspect, a molded article formed from the disclosed polymer composition can exhibit a desirable plating index. For example, according to aspects, a molded article formed from the disclosed polymer composition can exhibit a plating index in the range of from about 0.70 to about 1.50, including exemplary values of about 0.71, 0.72, 0.73, 0.74, 0.75, 0.76, 0.77, 0.78, 0.79, 0.80, 0.81, 0.82, 0.83, 0.84, 0.85, 0.86, 0.87, 0.88, 0.89, 0.90, 0.91, 0.92, 0.93, 0.94, 0.95, 0.96, 0.97, 0.98, 0.99. 1.00, 1.01, 1.02, 1.03, 1.04, 1.05, 1.06, 1.07, 1.08, 1.09, 1.1, 1.11, 1.12, 1.13, 1.14, 1.15, 1.16, 1.17, 1.18, 1.19, 1.20, 1.21, 1.22, 1.23, 1.24, 1.25, 1.26, 1.27, 1.28, 1.29, 1.30, 1.31, 1.32, 1.33, 1.34, 1.35, 1.36, 1.37, 1.38, 1.39, 1.40, 1.41, 1.42, 1.43, 1.44, 1.45, 1.46, 1.47, 1.48, and about 1.49. In still further aspects, the plating index can be in a range derived from any two of the above listed exemplary plating indexes. For example, the plating index can be in the range of from about 0.70 to about 1.40.

In one aspect, a molded article formed from the disclosed polymer composition is capable of having an enhanced plating efficiency of at least about 2% to about 75% relatively to a substantially identical reference composition in the absence of the laser direct structuring synergist. For example, according to aspects, a molded article formed from the disclosed polymer composition is capable of having an enhanced plating efficiency of in the range of from about 2% to about 50%, including exemplary values of about 3%, 4%, 5%, 6%, 7%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, and about 49% relatively to a substantially identical reference composition in the absence of the laser direct structuring synergist. In still still further aspects, an enhanced plating efficiency can be in a range derived from any two of the above listed exemplary plating efficiencies. For example, the enhanced plating efficiency efficiency can be in the range of from about 9% to about 30% relatively to a substantially identical reference composition in the absence of the laser direct structuring synergist.

In one aspect, a molded article formed from the disclosed polymer composition is capable of having an enhanced plating efficiency in a broad window of the laser parameters with a statistical variance of at least about 2% to about 75% lower than that measured for a substantially identical reference composition in the absence of a laser direct structuring synergist.

In another aspect, a molded article formed from the disclosed polymer composition can exhibit plating index values with the statistical variance of in the range of from about 2% to about 50%, including exemplary values of about 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, and about 49% lower than that measured for a substantially identical reference composition in the absence of a laser direct structuring synergist. In still further aspects, the statistical variance can be in a range derived from any two of the above listed exemplary statistical variances. For example, the statistical variance can be in the range of from about 9% to about 30%.

A. Polycarbonate Polymer Component

The term polycarbonate as used herein is not intended to refer to only a specific polycarbonate or group of polycarbonates, but rather refers to the any one of the class of compounds containing a repeating chain of carbonate groups. In one aspect, a polycarbonate material can include any one or more of those polycarbonate materials disclosed and described in U.S. Pat. No. 7,786,246, which is hereby incorporated by reference in its entirety for the specific purpose of disclosing various polycarbonate compositions and methods for manufacture of same.

In one aspect, a polycarbonate polymer component as disclosed herein can be an aliphatic-diol based polycarbonate. In another aspect, the polycarbonate polymer component can comprise a carbonate unit derived from a dihydroxy compound, such as, for example, a bisphenol that differs from the aliphatic diol. In still further aspects, an exemplary exemplary polycarbonate polymer component includes aromatic polycarbonates conventionally manufactured through a transesterification reaction of an one or more aromatic dihydroxy compound(s) and a carbonic acid diester in the presence of one or more catalyst(s).

In one aspect, non-limiting examples of suitable bisphenol compounds include the following: 4,4'-dihydroxybiphenyl, 1,6-dihydroxynaphthalene, 2,6-dihydroxynaphthalene, bis(4-hydroxyphenyl)methane, bis(4-hydroxyphenyl)diphenylmethane, bis(4-hydroxyphenyl)-1-naphthylmethane, 1,2-bis(4-hydroxyphenyl)ethane, 1,1-bis(4-hydroxyphenyl)-1-phenylethane, 2-(4-hydroxyphenyl)-2-(3-hydroxyphenyl)propane, bis(4-hydroxyphenyl)phenylmethane, 2,2-bis(4-hydroxy-3-bromophenyl)propane, 1,1-bis(hydroxyphenyl)cyclopentane, 1,1-bis(4-hydroxyphenyl)cyclohexane, 1,1-bis(4-hydroxy-3 methylphenyl)cyclohexane 1,1-bis(4-hydroxyphenyl)isobutene, 1,1-bis(4-hydroxyphenyl)cyclododecane, trans-2,3-bis(4-hydroxyphenyl)-2-butene, 2,2-bis(4-hydroxyphenyl)adamantine, (alpha,alpha'-bis(4-hydroxyphenyl)toluene, bis(4-hydroxyphenyl)acetonitrile, 2,2-bis(3-methyl-4-hydroxyphenyl)propane, 2,2-bis(3-ethyl-4-hydroxyphenyl)propane, 2,2-bis(3-n-propyl-4-hydroxyphenyl)propane, 2,2-bis(3-isopropyl-4-hydroxyphenyl)propane, 2,2-bis(3-sec-butyl-4-hydroxyphenyl)propane, 2,2-bis(3-t-butyl-4-hydroxyphenyl)propane, 2,2-bis(3-cyclohexyl-4-hydroxyphenyl)propane, 2,2-bis(3-allyl-4-hydroxyphenyl)propane, 2,2-bis(3-methoxy-4-hydroxyphenyl)propane, 2,2-bis(4-hydroxyphenyl)hexafluoropropane, 1,1-dichloro-2,2-bis(4-hydroxyphenyl)ethylene, 1,1-dibromo-2,2-bis(4-hydroxyphenyl)ethylene, 1,1-dichloro-2,2-bis(5-phenoxy-4-hydroxyphenyl)ethylene, 4,4'-dihydroxybenzophenone, 3,3-bis(4-hydroxyphenyl)-2-butanone, 1,6-bis(4-hydroxyphenyl)-1,6-hexanedione, ethylene glycol bis(4-hydroxyphenyl)ether, bis(4-hydroxyphenyl)ether, bis(4-hydroxyphenyl)sulfide, bis(4-hydroxyphenyl)sulfoxide, bis(4-hydroxyphenyl)sulfone, 9,9-bis(4-hydroxyphenyl)fluorene, 2,7-dihydroxypyrene, 6,6'-dihydroxy-3,3,3',3'-tetramethylspiro(bis)indane ("spirobiindane bisphenol"), 3,3-bis(4-hydroxyphenyl)phthalide, 2,6-dihydroxydibenzo-p-dioxin, 2,6-dihydroxythianthrene, 2,7-dihydroxyphenoxathin, 2,7-dihydroxy-9,10-dimethylphenazine, 3,6-dihydroxydibenzofuran, 3,6-dihydroxydibenzothiophene, and 2,7-dihydroxycarbazole, and the like, as well as combinations comprising at least one of the foregoing dihydroxy aromatic compounds.

In another aspect, exemplary bisphenol compounds can comprise 1,1-bis(4-1,1-bis(4-hydroxyphenyl)methane, 1,1-bis(4-hydroxyphenyl)ethane, 2,2-bis(4-2,2-bis(4-hydroxyphenyl)propane (hereinafter "bisphenol A" or "BPA"), 2,2-bis(4-2,2-bis(4-hydroxyphenyl)butane, 2,2-bis(4-hydroxyphenyl)octane, 1,1-bis(4-1,1-bis(4-hydroxyphenyl)propane, 1,1-bis(4-hydroxyphenyl)n-butane, 2,2-bis(4-hydroxy-1-2,2-bis(4-hydroxy-1-methylphenyl)propane, 1,1-bis(4-hydroxy-t-butylphenyl)propane, 3,3-3,3-bis(4-hydroxyphenyl)phthalimidine, 2-phenyl-3,3-bis(4-hydroxyphenyl)phthalimidine ("PPPBP"), and 9,9-bis(4-hydroxyphenyl)fluorene. Combinations comprising at least one dihydroxy aromatic compound can also be used. In another aspect, other types of diols can be present in the polycarbonate.

In a yet another aspect, polycarbonates with branching groups can be useful, provided that such branching does not significantly adversely affect desired properties of the polycarbonate. Branched polycarbonate blocks can be prepared by adding a branching agent during polymerization. These branching agents include polyfunctional organic compounds containing at least three functional groups selected from hydroxyl, carboxyl, carboxylic anhydride, haloformyl, and mixtures of the foregoing functional groups. Specific examples include trimellitic acid, trimellitic anhydride, trimellitic trichloride, tris-p-hydroxy phenyl ethane, isatin-bis-phenol, tris-phenol TC (1,3,5-tris((p-hydroxyphenyl)isopropyl)benzene), tris-phenol PA (4(4(1,1-bis(p-hydroxyphenyl)-ethyl)alpha, alpha-dimethylbenzyl)phenol), 4-chloroformyl phthalic anhydride, trimesic acid, and benzophenone tetracarboxylic acid. In one aspect, a branching agent can be added at a level of about 0.05 to about 2.0 wt %. In a still another aspect, mixtures comprising linear polycarbonates and branched polycarbonates can be used.

The polycarbonate polymer component can comprise copolymers comprising carbonate units and other types of polymer units, including ester units, and combinations comprising at least one of homopolycarbonates and copolycarbonates. An exemplary polycarbonate copolymer of this type is a polyester carbonate, also known as a polyester-polycarbonate. Such copolymers further contain carbonate units derived from oligomeric ester-containing dihydroxy compounds (also referred to herein as hydroxy end-capped oligomeric acrylate esters). In another aspect, the first polycarbonate component does not comprise a separate polymer such as a polyester. In one aspect, an aliphatic-based polycarbonate comprises aliphatic units that are either aliphatic carbonate units derived from aliphatic diols, or a combination of aliphatic ester units derived from aliphatic diacids having greater than 13 carbons.

In one aspect, the molecular weight of any particular polycarbonate can be determined by, for example, gel permeation chromatography using universal calibration methods based on polystyrene (PS) standards. Generally polycarbonates can have a weight average molecular weight (Mw), of greater than about 5,000 g/mol based on PS standards. In one aspect, the polycarbonates can have an Mw of greater than or equal to about 20,000 g/mol, based on PS standards. In another aspect, the polycarbonates have an Mw based on PS standards of about 20,000 to 100,000 g/mol, including for example 30,000 g/mol, 40,000 g/mol, 50,000 g/mol, 60,000 g/mol, 70,000 g/mol, 80,000 g/mol, or 90,000 g/mol. In still further aspects, the polycarbonates have an Mw based on PS standards of about 22,000 to about 50,000 g/mol. In still further aspects, the polycarbonates have an Mw based on PS standards of about 25,000 to 40,000 g/mol.

Molecular weight (Mw and Mn) as described herein, and polydispersity as calculated therefrom, can be determined using gel permeation chromatography (GPC), using a cross-linked styrene-divinylbenzene column, and either PS or PC standards as specified. GPC samples can be prepared in a solvent such as methylene chloride or chloroform at a concentration of about 1 mg/ml, and can be eluted at a flow rate of about 0.2 to 1.0 ml/min. In one aspect, the glass transition temperature (Tg) of a polycarbonate can be less than or equal to about 160° C., less than or equal to about 150° C., less than or equal to about 145° C., less than or equal to about 140° C., or less than or equal to about 135° C. In a further aspect, the glass transition temperature of a polycarbonate can be from about 85° C. to about 160° C., from about 90° C. to about 160° C., from about 90° C. to about 150° C., or from about 90° C. to about 145° C. In a still further aspect, the glass transition temperature of a polycarbonate can be from about 85° C. to about 130° C., from about 90° C. to about 130° C., from about 90° C. to about 125° C., or from about 90° C. to about 120° C.

In one aspect, disclosed polycarbonate polymer components can be manufactured using an interfacial phase transfer process or melt polymerization. Although the reaction conditions for interfacial polymerization can vary, an exemplary process generally involves dissolving or dispersing a dihydric phenol reactant in aqueous caustic soda or potash, adding the resulting mixture to a water-immiscible solvent medium such as for example methylene chloride, and contacting the reactants with a carbonate precursor (such as phosgene) in the presence of a catalyst such as, for example, triethylamine or a phase transfer catalyst salt, under controlled pH conditions of, for example, about 8 to about 10.

The polycarbonate can, in various aspects, be prepared by a melt polymerization process. Generally, in the melt polymerization process, polycarbonates are prepared by co-reacting, in a molten state, the dihydroxy reactant(s) and a diaryl carbonate ester, such as diphenyl carbonate, or more specifically in an aspect, an activated carbonate such as bis(methyl salicyl)carbonate, in the presence of a transesterification catalyst. The reaction can be carried out in typical polymerization equipment, such as one or more continuously stirred reactors (CSTRs), plug flow reactors, wire wetting fall polymerizers, free fall polymerizers, wiped film polymerizers, BANBURY® mixers, single or twin screw extruders, or combinations of the foregoing. In one aspect, volatile monohydric phenol can be removed from the molten reactants by distillation and the polymer is isolated as a molten residue. In another aspect, a useful melt process for making polycarbonates utilizes a diaryl carbonate ester having electron-withdrawing substituents on the aryls. Examples of specifically useful diaryl carbonate esters with electron withdrawing substituents include bis(4-nitrophenyl)carbonate, bis(2-chlorophenyl)carbonate, bis(4-chlorophenyl)carbonate, bis(methyl salicyl)carbonate, bis(4-methylcarboxylphenyl)carbonate, bis(2-acetylphenyl) carboxylate, bis(4-acetylphenyl)carboxylate, or a combination comprising at least one of the foregoing.

The melt polymerization can include a transesterification catalyst comprising a first catalyst, also referred to herein as an alpha catalyst, comprising a metal cation and an anion. In one aspect, the cation is an alkali or alkaline earth metal comprising Li, Na, K, Cs, Rb, Mg, Ca, Ba, Sr, or a combination comprising at least one of the foregoing. The anion is hydroxide ($OH^-$), superoxide ($O_2^-$), thiolate ($HS^-$), sulfide ($S_2^-$), a $C_{1-20}$ alkoxide, a $C_{6-20}$ aryloxide, a $C_{1-20}$ carboxylate, a phosphate including biphosphate, a $C_{1-20}$ phosphonate, a sulfate including bisulfate, sulfites including bisulfites and metabisulfites, a $C_{1-20}$ sulfonate, a carbonate including bicarbonate, or a combination comprising at least one of the foregoing. In another aspect, salts of an organic acid comprising both alkaline earth metal ions and alkali metal ions can also be used. Salts of organic acids useful as catalysts are illustrated by alkali metal and alkaline earth metal salts of formic acid, acetic acid, stearic acid and ethyelenediamine tetraacetic acid. The catalyst can also comprise the salt of a non-volatile inorganic acid. By "nonvolatile", it is meant that the referenced compounds have no appreciable vapor pressure at ambient temperature and pressure. In particular, these compounds are not volatile at temperatures at which melt polymerizations of polycarbonate are typically conducted. The salts of nonvolatile acids are alkali metal salts of phosphites; alkaline earth metal salts of phosphites; alkali metal salts of phosphates; and alkaline earth metal salts of phosphates. Exemplary transesterification catalysts include, lithium hydroxide, sodium hydroxide, potassium hydroxide, cesium hydroxide, magnesium hydroxide, calcium hydroxide, barium hydroxide, lithium formate, sodium formate, potassium formate, cesium formate, lithium acetate, sodium acetate, potassium acetate, lithium carbonate, sodium carbonate, potassium carbonate, lithium methoxide, sodium methoxide, potassium lithium ethoxide, sodium ethoxide, potassium ethoxide, lithium phenoxide, sodium phenoxide, potassium phenoxide, sodium sulfate, potassium sulfate, $NaH_2PO_3$, $NaH_2PO_4$, $Na_2H_2PO_3$, $KH_2PO_4$, $CsH_2PO_4$, $Cs_2H_2PO_4$, $Na_2SO_3$, $Na_2S_2O_5$, sodium mesylate, potassium mesylate, sodium tosylate, potassium tosylate, magnesium disodium ethylenediamine tetraacetate (EDTA magnesium disodium salt), or a combination comprising at least one of the foregoing. It will be understood that the foregoing list is exemplary and should not be considered as limited thereto. In one aspect, the transesterification catalyst is an alpha catalyst comprising an alkali or alkaline earth salt. In an exemplary aspect, the transesterification catalyst comprising sodium hydroxide, potassium hydroxide, sodium carbonate, potassium carbonate, sodium methoxide, potassium methoxide, $NaH_2PO_4$, or a combination comprising at least one of the foregoing.

The amount of alpha catalyst can vary widely according to the conditions of the melt polymerization, and can be about 0.001 to about 500 μmol. In an aspect, the amount of alpha catalyst can be about 0.01 to about 20 μmol, specifically about 0.1 to about 10 μmol, more specifically about 0.5 to about 9 μmol, and still more specifically about 1 to about 7 μmol, per mole of aliphatic diol and any other dihydroxy compound present in the melt polymerization. In another aspect, a second transesterification catalyst, also referred to herein as a beta catalyst, can optionally be included in the melt polymerization process, provided that the inclusion of such a second transesterification catalyst does not significantly adversely affect the desirable properties of the polycarbonate. Exemplary transesterification catalysts can further include a combination of a phase transfer catalyst of formula $(R_3)_4Q+X$ above, wherein each $R_3$ is the same or different, and is a C1-10 alkyl group; Q is a nitrogen or phosphorus atom; and X is a halogen atom or a C1-8 alkoxy group or C6-18 aryloxy group. Exemplary phase transfer catalyst salts include, for example, $[CH_3(CH_2)_3]_4NX$, $[CH_3(CH_2)_3]_4PX$, $[CH_3(CH_2)_5]_4NX$, $[CH_3(CH_2)_6]_4NX$, $[CH_3(CH_2)_4]_4NX$, $CH_3[CH_3(CH_2)_3]_3NX$, and $CH_3[CH_3(CH_2)_2]_3NX$, wherein X is Cl—, Br—, a C1-8 alkoxy group or a C6-18 aryloxy group. Examples of such transesterification catalysts include tetrabutylammonium hydroxide, methyltributylammonium hydroxide, tetrabutylammonium acetate, tetrabutylphosphonium hydroxide, tetrabutylphosphonium acetate, tetrabutylphosphonium phenolate, or a combination comprising at least one of the foregoing. Other melt transesterification catalysts include alkaline earth metal salts or alkali metal salts. In various aspects, where a beta catalyst is desired, the beta catalyst can be present in a molar ratio, relative to the alpha catalyst, of less than or equal to 10, specifically less than or equal to 5, more specifically less than or equal to 1, and still more specifically less than or equal to 0.5. In other aspects, the melt polymerization reaction disclosed herein uses only an alpha catalyst as described hereinabove, and is substantially free of any beta catalyst. As defined herein, "substantially free of" can mean where the beta catalyst has been excluded from the melt polymerization reaction. In one aspect, the beta catalyst is present in an amount of less than about 10 ppm, specifically less than 1 ppm, more specifically less than about 0.1 ppm, more specifically less than or equal to about 0.01 ppm, and more specifically less than or equal to about 0.001 ppm, based on the total weight of all components used in the melt polymerization reaction.

In one aspect, a melt process employing an activated carbonate is utilized. As used herein, the term "activated carbonate", is defined as a diarylcarbonate that is more reactive than diphenylcarbonate in transesterification reactions. Specific non-limiting examples of activated carbonates include bis(o-methoxycarbonylphenyl)carbonate, bis(o-bis(o-chlorophenyl)carbonate, bis(o-nitrophenyl)carbonate, bis(o-acetylphenyl)carbonate, bis(o-phenylketonephenyl)carbonate, bis(o-formylphenyl)carbonate. Examples of specific ester-substituted diarylcarbonates include, but are not limited to, bis(methylsalicyl)carbonate (CAS Registry No. 82091-12-1) (also known as BMSC or bis(o-bis(o-methoxycarbonylphenyl)carbonate), bis(ethylsalicyl)carbonate, bis(propylsalicyl)carbonate, bis(butylsalicyl)carbonate, bis(benzylsalicyl)carbonate, bis(methyl-4-chlorosalicyl)carbonate and the like. In one aspect, bis(methylsalicyl)carbonate is used as the activated carbonate in melt polycarbonate synthesis due to its lower molecular weight and higher vapor pressure. Some non-limiting examples of non-activating groups which, when present in an ortho position, would not be expected to result in activated carbonates are alkyl, cycloalkyl or cyano groups. Some specific and non-limiting examples of non-activated carbonates are bis(o-methylphenyl)carbonate, bis(p-cumylphenyl)carbonate, bis(p-(1,1,3,3-tetramethyl)butylphenyl)carbonate and bis(o-cyanophenyl)carbonate. Unsymmetrical combinations of these structures can also be used as non-activated carbonates.

In one aspect, an end-capping agent (also referred to as a chain-stopper) can optionally be used to limit molecular weight growth rate, and so control molecular weight in the polycarbonate. Exemplary chain-stoppers include certain monophenolic compounds (i.e., phenyl compounds having a single free hydroxy group), monocarboxylic acid chlorides, and/or monochloroformates. Phenolic chain-stoppers are exemplified by phenol and C1-C22 alkyl-substituted phenols such as p-cumyl-phenol, resorcinol monobenzoate, and p- and tertiary-butyl phenol, cresol, and monoethers of diphenols, such as p-methoxyphenol. Alkyl-substituted phenols with branched chain alkyl substituents having 8 to 9 carbon atoms can be specifically mentioned. Certain monophenolic UV absorbers can also be used as a capping agent, for example 4-substituted-2-hydroxybenzophenones and their derivatives, aryl salicylates, monoesters of diphenols such as resorcinol monobenzoate, 2-(2-hydroxyaryl)-benzotriazoles and their derivatives, 2-(2-hydroxyaryl)-1,3,5-triazines and their derivatives, and the like.

In another aspect, endgroups can be derived from the carbonyl source (i.e., the diaryl carbonate), from selection of monomer ratios, incomplete polymerization, chain scission, and the like, as well as any added end-capping groups, and can include derivatizable functional groups such as hydroxy groups, carboxylic acid groups, or the like. In one aspect, the endgroup of a polycarbonate can comprise a structural unit derived from a diaryl carbonate, where the structural unit can be an endgroup. In a further aspect, the endgroup is derived from an activated carbonate. Such endgroups can be derived from the transesterification reaction of the alkyl ester of an appropriately substituted activated carbonate, with a hydroxy group at the end of a polycarbonate polymer chain, under conditions in which the hydroxy group reacts with the ester carbonyl from the activated carbonate, instead of with the carbonate carbonyl of the activated carbonate. In this way, structural units derived from ester containing compounds or substructures derived from the activated carbonate and present in the melt polymerization reaction can form ester endgroups. In another aspect, the ester endgroup derived from a salicylic ester can be a residue of BMSC or other substituted or unsubstituted bis(alkyl salicyl)carbonate such as bis(ethyl salicyl)carbonate, bis(propyl salicyl)carbonate, bis(phenyl salicyl)carbonate, bis(benzyl salicyl)carbonate, or the like. In one aspect, where a combination of alpha and beta catalysts are used in the melt polymerization, a polycarbonate polymer prepared from an activated carbonate can comprise endgroups in an amount of less than 2,000 ppm, less than 1,500 ppm, or less than 1,000 ppm, based on the weight of the polycarbonate. In another aspect, where only an alpha catalyst is used in the melt polymerization, a polycarbonate polymer prepared from an activated carbonate can comprise endgroups in an amount of less than or equal to 500 ppm, less than or equal to 400 ppm, less than or equal to 300 ppm, or less than or equal to 200 ppm, based on the weight of the polycarbonate.

In one aspect, the reactants for the polymerization reaction using an activated aromatic carbonate can be charged into a reactor either in the solid form or in the molten form. Initial charging of reactants into a reactor and subsequent mixing of these materials under reactive conditions for polymerization can be conducted in an inert gas atmosphere such as a nitrogen atmosphere. The charging of one or more reactants can also be done at a later stage of the polymerization reaction. Mixing of the reaction mixture is accomplished by any methods known in the art, such as by stirring. Reactive conditions include time, temperature, pressure and other factors that affect polymerization of the reactants. Typically the activated aromatic carbonate is added at a mole ratio of 0.8 to 1.3, and more preferably 0.9 to 1.3, and all subranges there between, relative to the total moles of monomer unit compounds (i.e., aromatic dihydroxy compound, and aliphatic diacid or diol). In a specific aspect, the molar ratio of activated aromatic carbonate to monomer unit compounds is 1.013 to 1.29, specifically 1.015 to 1.028. In another specific aspect, the activated aromatic carbonate is BMSC.

In one aspect, the melt polymerization reaction can be conducted by subjecting the reaction mixture to a series of temperature-pressure-time protocols. In some aspects, this involves gradually raising the reaction temperature in stages while gradually lowering the pressure in stages. In one aspect, the pressure is reduced from about atmospheric pressure at the start of the reaction to about 1 millibar (100 Pa) or lower, or in another aspect to 0.1 millibar (10 Pa) or lower in several steps as the reaction approaches completion. The temperature can be varied in a stepwise fashion beginning at a temperature of about the melting temperature of the reaction mixture and subsequently increased to final temperature. In one aspect, the reaction mixture is heated from room temperature to about 150° C. In such an aspect, the polymerization reaction starts at a temperature of about 150° C. to about 220° C. In another aspect, the polymerization temperature can be up to about 220° C. In other aspects, the polymerization reaction can then be increased to about 250° C. and then optionally further increased to a temperature of about 320° C., and all subranges there between. In one aspect, the total reaction time can be from about 30 minutes to about 200 minutes and all subranges there between. This procedure will generally ensure that the reactants react to give polycarbonates with the desired molecular weight, glass transition temperature and physical properties. The reaction proceeds to build the polycarbonate chain with production of ester-substituted alcohol by-product such as methyl salicylate. In one aspect, efficient removal of the by-product can be achieved by different techniques such as reducing the pressure. Generally the pressure starts relatively high in the beginning of the reaction and is lowered progressively throughout the reaction and temperature is raised throughout the reaction.

In one aspect, the progress of the reaction can be monitored by measuring the melt viscosity or the weight average molecular weight of the reaction mixture using techniques known in the art such as gel permeation chromatography. These properties can be measured by taking discrete samples or can be measured on-line. After the desired melt viscosity and/or molecular weight is reached, the final polycarbonate product can be isolated from the reactor in a solid or molten form. It will be appreciated by a person skilled in the art, that the method of making aliphatic homopolycarbonate and aliphatic-aromatic copolycarbonates as described in the preceding sections can be made in a batch or a continuous process and the process disclosed herein is preferably carried out in a solvent free mode. Reactors chosen should ideally be self-cleaning and should minimize any "hot spots." However, vented extruders similar to those that are commercially available can be used.

In one aspect, the aliphatic homopolycarbonate and aliphatic-aromatic copolycarbonate can be prepared in an extruder in presence of one or more catalysts, wherein the carbonating agent is an activated aromatic carbonate. In one aspect, the reactants for the polymerization reaction can be fed to the extruder in powder or molten form. In another aspect, the reactants are dry blended prior to addition to the extruder. The extruder can be equipped with pressure reducing devices (e.g., vents), which serve to remove the activated phenol by-product and thus drive the polymerization reaction toward completion. The molecular weight of the polycarbonate product can, in various aspects, be manipulated by controlling, among other factors, the feed rate of the reactants, the type of extruder, the extruder screw design and configuration, the residence time in the extruder, the reaction temperature and the pressure reducing techniques present on the extruder. The molecular weight of the polycarbonate product can also depend upon the structures of the reactants, such as, activated aromatic carbonate, aliphatic diol, dihydroxy aromatic compound, and the catalyst employed. Many different screw designs and extruder configurations are commercially available that use single screws, double screws, vents, back flight and forward flight zones, seals, and side streams. One skilled in the art can find the best designs using generally known principals of commercial extruder design. Controlling the ratio diarylcarbonate/diol, specifically BMSC/diol can impact the Mw when using an activated carbonate. A lower ratio can generally give a higher molecular weight.

In an exemplary aspect, the polycarbonate polymer component comprises a bisphenol A polycarbonate polymer. In another exemplary aspect, the polycarbonate component comprises a blend of at least two different grade bisphenol A polycarbonates. To that end, a polycarbonate grade can, for example, be characterized by the melt volume rate (MVR) of the polycarbonate. For example, a disclosed polycarbonate, such as a bisphenol A polycarbonate, can be characterized by exhibiting a melt Volume Rate (MVR) in the range of from 4 g/10 min to 30 g/10 min at 300° C./1.2 kg. For example, the MVR can range from 10 g/10 min to 25 g/10 min, including for example an MVR in the range of from 15 g/10 min to 20 g/10 min. Further, for example, the MVR can be in the range of from 4 g/10 min or 30 g/10 min.

The polycarbonate component can be present in the polymer composition in any desired amount. For example, according to aspects of the disclosure, the polycarbonate polymer component can be present in an amount in the range of from about 10 weight % up to about 90 weight % relative to the total weight of the polymer composition, including further exemplary amounts of about 15 weight %, 20 weight %, 25 weight %, 30 weight %, 35 weight %, 40 weight %, 45 weight %, 50 weight %, 55 weight %, 60 weight %, 65 weight %, 70 weight %, 75 weight %, 80 weight %, and about 85 weight %. In still further aspects, the polycarbonate component can be present within any range of amount derived from any two of the above states values. For example, the polycarbonate polymer component can be present in an amount in the range of from about 10 weight % to about 20 weight %, or in an amount in the range of from about 10 weight % to about 30 weight %, or in an amount in the range of from about 50 weight % to about 90 weight %.

In aspects where the polycarbonate component comprises a blend of two or more polycarbonate polymers, it should be understood that each respect polycarbonate polymer present within the polycarbonate component can be present in any desired amount relative to the total weight percentage of the polycarbonate polymer component. For example, in an aspect wherein the polycarbonate polymer component comprises at least a first and a second polycarbonate polymer, the first polycarbonate polymer can be present in an amount in the range of from greater than 0 weight % to less than 100 weight % relative to the total weight of the polycarbonate polymer component. Similarly, the second polycarbonate polymer can also be present in an amount in the range of from greater than 0 weight % to less than 100 weight % relative to the total weight of the polycarbonate polymer component.

For example, in an exemplary aspect, a polycarbonate polymer component comprising two different grade bisphenol A polycarbonates can be present in the polymer composition in an amount in the range of from about 14 to 16 weight percent. According to this aspect, a first bisphenol A polycarbonate can be present in an amount in the range of from about 5 to about 6 weight percent relative to the total weight of polymer composition or, expressed in an alternative manner, in an amount in the range of from 35 weight percent to about 45 weight percent relative to the total weight percent of the polycarbonate component. Likewise, the second bisphenol A polycarbonate can be present in an amount in the range of from about 9 to about 10 weight percent relative to the total weight of polymer composition or, expressed in an alternative manner, in an amount in the range of from 55 weight percent to about 65 weight percent relative to the total weight percent of the polycarbonate component. In at least one aspect, the at least one polycarbonate comprises at least 5 weight percentage relative to the polymer composition's total weight percentage. For example, the total polycarbonate amount ranges from about 5 weight % to about 14 weight %, relative to the polymer composition's total weight percentage.

In another exemplary aspect, a polycarbonate polymer component comprising two different grade bisphenol A polycarbonates can be present in the polymer composition in an amount in the range of from about 70 weight % to 72 weight %. According to this aspect, a first bisphenol A polycarbonate can be present in an amount in the range of from about 53 weight % to about 54 weight % relative to the total weight of polymer composition or, expressed in an alternative manner, in an amount in the range of from about 73 weight % to about 78 weight % relative to the total weight percent of the polycarbonate component. Likewise, the second bisphenol A polycarbonate can be present in an amount in the range of from about 17 weight % to about 18 weight % relative to the total weight of polymer composition or, expressed in an alternative manner, in an amount in the range of from 22 weight % to about 27 weight % relative to the total weight percent of the polycarbonate component.

B. Laser Direct Structuring Additive

The disclosed polymer composition further comprises a laser direct structuring (LDS) additive. As used herein, a laser direct structuring additive can refer to a metal containing additive suitable for use in a laser direct structuring process. To that end, as discussed more fully herein, an LDS additive is selected such that, after activating with a laser, a conductive path can be formed by a subsequent standard metallization or plating process. As such, when the LDS additive is exposed to a laser, elemental metal is released or activated.

In one aspect, a laser direct structuring additive is capable of being activated by electromagnetic radiation and thereby forming elemental metal nuclei. The laser thus draws the circuit pattern onto the polymer part and leaves behind a roughened surface containing embedded metal particles. These particles act as nuclei for the crystal growth during a subsequent metallization or plating process, such as a copper plating process or other plating processes, including gold plating, nickel plating, silver plating, zinc plating, tin plating or the like.

According to aspects of the disclosure, the laser direct structuring additive can comprise one or more heavy metal oxides, including for example, oxides of chromium, copper, or combinations thereof; the laser direct structuring additive can also have a spinel type crystal structure; one or more copper salts, or a combination thereof. An exemplary and non-limiting example of a commercially available laser direct structuring additive includes the Black 1G pigment black, commercially available from The Shepherd Color company. The Black 1G pigment black comprises chromium oxides ($Cr_2O_3$, $Cr_2O_4^{2-}$, $Cr_2O_7^{2-}$) and oxides of copper (CuO) and has a pH of about 7.3. The Black 1G pigment also has a spinel type crystal structure. Another exemplary commercially available laser direct structuring additive is Lazerflair 8840, commercially available from Merck. The Lazerflair 8840 comprises copper salts comprising copper hydroxide phosphate ($Cu_2OHPO_4$).

In one aspect, the LDS additive comprises a heavy metal mixture oxide spinel, a copper salt, or a combination thereof.

In another aspect, the LDS additive has a mean particle size in an amount that ranges from about 0.01 μm to about 100 μm, including exemplary values of about 0.05 μm, 0.08 μm, 0.1 μm, 0.2 μm, 0.3 μm, 0.4 μm, 0.5 μm, 0.6 μm, 0.7 μm, 0.8 μm, 0.9 μm, 1.0 μm, 2 μm, 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18 μm, 19 μm, 20 μm, 21 μm, 22 μm, 23 μm, 24 μm, 25 μm, 26 μm, 27 μm, 28 μm, 29 μm, 30 μm, 31 μm, 32 μm, 33 μm, 34 μm, 35 μm, 36 μm, 37 μm, 38 μm, 39 v, 40 μm, 41 μm, 42 μm, 43 μm, 44 μm, 45 μm, 46 μm, 47 μm, 48 μm, 49 μm, 50 μm, 51 μm, 52 μm, 53 μm, 54 μm, 55 μm, 56 μm, 57 μm, 58 μm, 59 μm, 60 μm, 61 μm, 62 μm, 63 μm, 64 μm, 65 μm, 66 μm, 67 μm, 68 v, 69 μm, 70 μm, 71 μm, 72 μm, 73 μm, 74 μm, 75 μm, 76 μm, 77 μm, 78 μm, 79 μm, 80 μm, 81 μm, 82 μm, 83 μm, 84 μm, 85 μm, 86 μm, 87 μm, 88 μm, 89 μm, 90 μm, 91 μm, 92 μm, 93 μm, 94 μm, 95 μm, 96 μm, 97 μm, 98 μm, and 99 μm. In still further aspects, the mean particle size can be in a range derived from any two of the above listed exemplary mean particle size values. For example, the mean particle size can be in the range of about 0.08 μm to about 90 μm. For example, the mean particle size can be in the range of about 0.5 μm to about 50 μm. In a yet further aspect, the mean particle size can be each exemplary value, for example, the mean particle size can be about 20 μm.

In one aspect, the LDS additive has combination of particles sizes with some of the particles having a mean particle size equal to or less than about 1 μm. In another aspect, the LDS additive comprises nano-size particles, about 0.01 μm to about 1 μm, including exemplary values of about 0.02 μm, 0.03 μm, 0.04 μm, 0.05 μm, 0.06 μm, 0.07 μm, 0.08 μm, 0.09 μm, 0.1 μm, 0.2 μm, 0.3 μm, 0.4 μm, 0.5 μm, 0.6 μm, 0.7 μm, 0.8 μm, and 0.9 μm. In further aspect, the particles larger than 1 μm can comprise particles with a mean particle of micro-size or of conventional size.

The laser direct structuring additive can be present in the polymer composition in an amount in the range of from greater than about zero to about 15 weight % relative to the total weight of the polymer composition, including for example, amounts of about 1 weight %, about 2 weight %, about 3 weight %, about 4 weight %, about 5 weight %, about 6 weight %, about 7 weight %, about 8 weight %, about 9 weight %, about 10 weight %, about 11 weight %, about 12 weight %, about 13 weight %, and about 14 weight %. In still further further aspects, the laser direct structure (LDS) additive can be present in the polymer composition in an amount within any range of amounts derived from any two of the above stated values. For example, the laser direct structuring additive can be present in an amount of from about 1 weight % to about 10 weight % relative to the total weight of the polymer composition. In an even further aspect, the laser direct structuring additive can be present in the polymer composition in an amount of about 1 weight % to about 7 weight % relative to the total weight of the polymer composition, or about 3 weight % relative to the total weight of the polymer composition. In a yet further aspect, the LDS additive can be present in the polymer composition in an amount of about 6 weight % relative to the total weight of the polymer composition.

C. Reinforcing Fillers

The present invention relates to conductive thermoplastic resin compositions having usefulness electronic applications.

The disclosed polymer composition further comprises one or more reinforcement fillers. The reinforcing filler can be selected to impart additional impact strength and/or provide additional characteristics that can be based on the final selected characteristics of the polymer composition. The specific composition of a reinforcing filler can vary, provided that the filler is chemically compatible with the remaining components of the polymer composition.

In another aspect, the reinforcing filler comprises, for example, $TiO_2$; fibers comprising asbestos or the like fibers; silicates and silica powders, aluminum silicate (mullite), synthetic calcium silicate, zirconium silicate, fused silica, crystalline silica graphite, natural silica sand, or the like; boron powders, boron-nitride powder, boron-silicate powders, or the like; alumina; magnesium oxide (magnesia); calcium sulfate (as its anhydride, dihydrate or trihydrate); calcium carbonates, chalk, limestone, marble, synthetic precipitated calcium carbonates, or the like; talc, including but not limited to fibrous, modular, needle shaped, lamellar talc, or the like; wollastonite; surface-treated wollastonite; glass spheres including but not limited to hollow and solid glass spheres, silicate spheres, cenospheres, aluminosilicate (armospheres), or the like; kaolin, including but not limited to hard kaolin, soft kaolin, calcined kaolin, kaolin including various coatings known in the art to facilitate compatibility with the polymeric matrix resin, or the like; single crystal fibers or "whiskers" including but not limited to silicon carbide, alumina, boron carbide, iron, nickel, copper, or the like; glass fibers, (including continuous and chopped fibers), including but not limited to E, A, C, ECR, R, S, D, and NE glasses and quartz, or the like; sulfides including but not limited to molybdenum sulfide, zinc sulfide or the like; barium compounds including but not limited to barium titanate, barium ferrite, barium sulfate, heavy spar, or the like; metals and metal oxides including but not limited to particulate or fibrous aluminum, bronze, zinc, copper and nickel or the like; flaked fillers including but not limited to as glass flakes, flaked silicon carbide, aluminum diboride, aluminum flakes, steel flakes or the like; fibrous fillers, for example short inorganic fibers including but not limited to those derived from blends including at least one of aluminum silicates, aluminum oxides, magnesium oxides, and calcium sulfate hemihydrate or the like; natural fillers and reinforcements, including but not limited to wood flour obtained by pulverizing wood, fibrous products such as cellulose, cotton, sisal, jute, starch, cork flour, lignin, ground nut shells, corn, rice grain husks or the like; reinforcing organic fibrous fillers formed from organic polymers capable of forming fibers including but not limited to poly(ether ketone), polyimide, polybenzoxazole, poly(phenylene sulfide), polyesters, polyethylene, aromatic polyamides, aromatic polyimides, polyetherimides, polytetrafluoroethylene, acrylic resins, poly(vinyl alcohol) or the like; as well as additional fillers and reinforcing agents including but not limited to mica, clay, feldspar, flue dust, fillite, quartz, quartzite, perlite, tripoli, diatomaceous earth, carbon black, or the like, or combinations including at least one of the foregoing fillers or reinforcing agents.

In one aspect, the disclosed polymer composition further comprises a reinforcing filler comprising a glass fiber, a mineral filler, or a carbon fiber, or a combination thereof.

In a yet further aspect, the reinforcing filler comprises a glass fiber, wherein the glass fiber has a cross section that can be round or flat. In another aspect, the glass fiber, for example, can be Nittobo (flat) glass fiber, CSG3PA820. In an even further aspect, the glass bead has a cross section that is round or flat.

The reinforcing filler can be present in the polymer composition in an amount in the range of from greater than about 5 weight % to about 60 weight % relative to the total weight of the polymer composition, including for example, amounts of about 10 weight %, about 15 weight %, about 20 weight %, about 25 weight %, about 30 weight %, about 35 weight %, about 40 weight %, about 45 weight %, about 50 weight %, and about 55 weight %. In still further aspects, the reinforcing filler additive can be present in the polymer composition in an amount within any range of amounts derived from any two of the above stated values. For example, the reinforcing filler additive can be present in an amount of from about 20 weight % to about 40 weight % relative to the total weight of the polymer composition. In an even further aspect, the reinforcing filler additive can be present in the polymer composition in an amount of about 25 weight % to about 35 weight % relative to the total weight of the polymer composition.

D. Laser Direct Structuring Synergist

The disclosed polymer composition further comprises a laser direct structuring synergist. In one aspect, the laser direct structuring synergist comprises a polycarbonate-polysiloxane copolymer, branched polycarbonate, or Talc, or a combination thereof. In another aspect, the laser direct structuring synergist does not comprise a substantially linear polycarbonate polymer.

The disclosed polymer composition further comprises a laser direct structuring synergist comprising a polycarbonate-polysiloxane block copolymer component. As used herein, the term polycarbonate-polysiloxane copolymer is equivalent to polysiloxane-polycarbonate copolymer, polycarbonate-polysiloxane polymer, or polysiloxane-polycarbonate polymer. The polysiloxane-polycarbonate copolymer comprises polydiorganosiloxane blocks comprising structural units of the general formula (I) below:

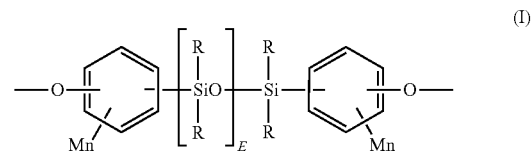

wherein the polydiorganosiloxane block length (E) is from about 20 to about 60; wherein each R group can be the same or different, and is selected from a $C_{1-13}$ monovalent organic group; wherein each M can be the same or different, and is selected from a halogen, cyano, nitro, $C_1$-$C_8$ alkylthio, $C_1$-$C_8$ alkyl, $C_1$-$C_8$ alkoxy, $C_2$-$C_8$ alkenyl, $C_2$-$C_8$ alkenyloxy group, $C_3$-$C_8$ cycloalkyl, $C_3$-$C_8$ cycloalkoxy, $C_6$-$C_{10}$ aryl, $C_6$-$C_{10}$ aryloxy, $C_2$-$C_{12}$ aralkyl, $C_7$-$C_{12}$ aralkoxy, $C_7$-$C_{12}$ alkylaryl, or $C_7$-$C_{12}$ alkylaryloxy, and where each n is independently 0, 1, 2, 3, or 4. The polysiloxane-polycarbonate copolymer also comprises polycarbonate blocks comprising structural units of the general formula (II) below:

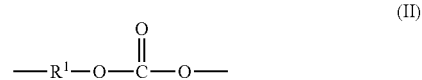

wherein at least 60 percent of the total number of $R^1$ groups comprise aromatic moieties and the balance thereof comprise aliphatic, alicyclic, or aromatic moieties.

According to exemplary non-limiting aspects of the disclosure, the polycarbonate-polysiloxane block copolymer comprises diorganopolysiloxane blocks of the general formula (III) below:

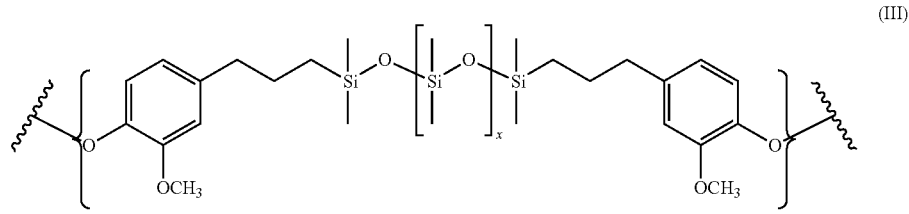

(III)

wherein x represents an integer from about 20 to about 60. The polycarbonate blocks according to these aspects can be derived from bisphenol-A monomers.

Diorganopolysiloxane blocks of formula (III) above can be derived from the corresponding dihydroxy compound of formula (IV):

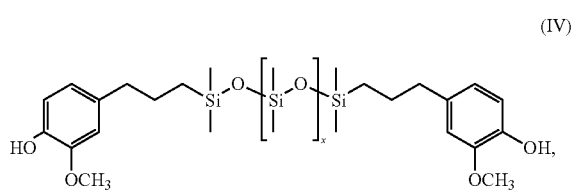

(IV)

wherein x is as described above. Compounds of this type and others are further described in U.S. Pat. No. 4,746,701 to Kress, et al and U.S. Pat. No. 8,017,0697 to Carrillo. Compounds of this formula can be obtained by the reaction of the appropriate dihydroxyarylene compound with, for example, an alpha,omega-bisacetoxypolydiorangonosiloxane under phase transfer conditions.

Such dihydroxy polysiloxanes can be made by effecting a platinum catalyzed addition between a siloxane hydride of the formula (V):

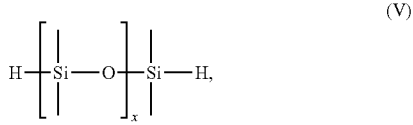

(V)

wherein x is a previously defined, and an aliphatically unsaturated monohydric phenol such as eugenol to yield a compound of formula (IV).

The polycarbonate-polysiloxane copolymer can be manufactured by reaction of a diphenolic polysiloxane, such as that depicted by formula (IV), with a carbonate source and a dihydroxy aromatic compound such as bisphenol-A, optionally in the presence of a phase transfer catalyst as described above. Suitable conditions are similar to those useful in forming polycarbonates. For example, the copolymers can be prepared by phosgenation at temperatures from below 0° C. to about 100° C., including for example, at temperatures from about 25° C. to about 50° C. Since the reaction is exothermic, the rate of phosgene addition can be used to control the reaction temperature. The amount of phosgene required will generally depend upon the amount of the dihydric reactants. Alternatively, the polycarbonate-polysiloxane copolymers can be prepared by co-reacting, in a molten state, the dihydroxy monomers and a diaryl carbonate ester, such as diphenyl carbonate, in the presence of a transesterification catalyst as described above.

In the production of the polycarbonate-polysiloxane copolymer, the amount of dihydroxy diorganopolysiloxane can be selected so as to provide the desired amount of diorganopolysiloxane units in the copolymer. The particular amounts used will therefore be determined depending on desired physical properties of the composition, the value of x (for example, within the range of about 20 to about 60), and the type and relative amount of each component in the composition, including the type and amount of polycarbonate, type and amount of polycarbonate-polysiloxane copolymer, and type and amount of any other additives. Suitable amounts of dihydroxy diorganopolysiloxane can be determined by one of ordinary skill in the art without undue experimentation using the guidelines taught herein.

For example, according to aspects of the disclosure, the polysiloxane-polycarbonate block copolymer can be provided having any desired level of siloxane content. For example, the siloxane content can be in the range of from 4 mole % to 30 mole %. In additional aspects, the siloxane content of the polysiloxane-polycarbonate block copolymer can be in the range of from 4 mole % to 10 mole %. In still further aspects, the siloxane content of the polysiloxane-polycarbonate block copolymer can be in the range of from 4 mole % to 8 mole %. In a further aspect, the polysiloxane-polycarbonate copolymer comprises a diorganosiloxane content in the range of from 5 to 7 mole wt %. In an even further exemplary aspect, the siloxane content of the polysiloxane-polycarbonate block copolymer can be about 6 mole %. Still further, the diorganopolysiloxane blocks can be randomly distributed in the polysiloxane-polycarbonate block copolymer.

The disclosed polycarbonate-polysiloxane block copolymers can also be end-capped as similarly described in connection with the manufacture of polycarbonates set forth herein. For example, according to aspects of the disclosure, a polysiloxane-polycarbonate block copolymer can be end capped with p-cumyl-phenol.

A non-limiting example of a polycarbonate-siloxane copolymer includes transparent EXL, available from SABIC Innovative Plastics. The transparent EXL from SABIC is a polycarbonate-polysiloxane (9030T) copolymer, having been tested commercially and found to have about 6 mole % siloxane, a Mw of about 44,600, and a Mn of about 17800 in a polystyrene standard using chloroform solvent.

The polycarbonate-polysiloxane copolymer component can be present in the polymer composition in any desired amount. For example, in aspects of the disclosure, the polycarbonate-polysiloxane copolymer is present in an amount of at least about 3 weight % to about 20 weight % relative to the total weight of the polymer composition. For example, the polycarbonate-polysiloxane copolymer can be present in an amount in the range of from about 4 weight % to about 20 weight % relative to the total weight of the polymer composition, including exemplary amounts of about 6 weight %, 7 weight %, 8 weight %, 9 weight %, 10 weight %, 11 weight %, 12 weight %, 13 weight %, 14 weight %, 15 weight %, 16 weight %, 17 weight %, 18 weight % and about 19 weight %. In still further aspects, the polycarbonate-polysiloxane copolymer can be present within any range of amounts derived from any two of the above stated values. For example, the polycarbonate-polysiloxane copolymer can be present in an amount in the range of from about 5 weight % to about 10 weight %.

In a yet another aspect, a laser direct structuring synergist comprises polycarbonate with branching groups.

In one aspect the branched polycarbonate block comprises a cyanophenyl endcapped polycarbonate having repeating structural units of the general formula (II) below:

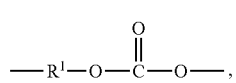
(II)

wherein at least 60 percent of the total number of R¹ groups comprise aromatic moieties and the balance thereof comprise aliphatic, alicyclic, or aromatic moieties; wherein the polycarbonate comprises terminal groups derived from reaction with a cyanophenol of the formula (VI):

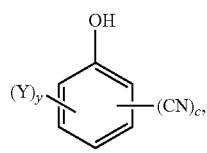
(VI)

wherein Y is a halogen, $C_{1-3}$ alkyl group, $C_{1-3}$ alkoxy group, $C_{7-12}$ arylakyl, $C_{7-12}$ alkylaryl, or nitro group; y is about 0 to about 4; and c is about 1 to about 5, provided that y+c is about 1 to about 5; wherein polycarbonate comprises a branching agent and a flame retardant.

In one aspect, the branched agent is a structure derived from a triacid trichloride of formula:

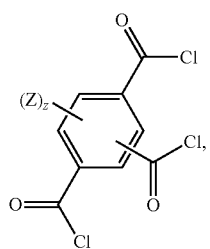

wherein Z is a hydrogen, halogen, $C_{1-3}$ alkyl group, $C_{1-3}$ alkoxy group, $C_{7-12}$ arylakyl, $C_{7-12}$ alkylaryl, or nitro group, and z is about 0 to about 3. In another aspect, the branching agent is a structure derived from a tri-substituted phenol of the formula:

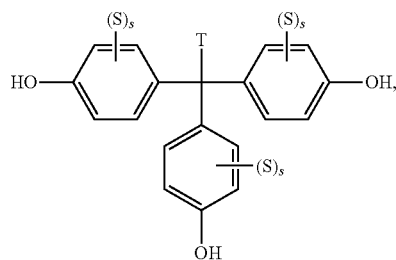

wherein T is a $C_{1-20}$ alkyl group, $C_{1-20}$ alkyleneoxy group, $C_{7-12}$ arylakyl, or alkylaryl, S is a hydrogen, a halogen, $C_{1-3}$ alkyl group, $C_{1-3}$ alkoxy group, $C_{7-12}$ arylakyl, $C_{7-12}$ alkylaryl, or nitro group, s is about 0 to about 4.

In one aspect, the branching agent comprises a structure of formula

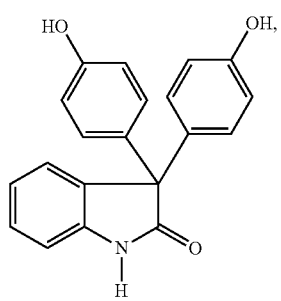 [SMILES: O=C1Nc2ccccc2C1(c1ccc(O)cc1)c1ccc(O)cc1]

or a combination of comprising one or more of the branched agents.

In one aspect, branched polycarbonate blocks can be prepared by adding a branching agent during polymerization. These branching agents include but are not limited to polyfunctional organic compounds containing at least three functional groups selected from hydroxyl, carboxyl, carboxylic anhydride, haloformyl, and mixtures of the foregoing functional groups. Specific examples include trimellitic acid, trimellitic anhydride, trimellitic trichloride, tris-p-hydroxy phenyl ethane, isatin-bis-phenol, tris-phenol TC (1,3,5-tris((p-(1,3,5-tris((p-hydroxyphenyl)isopropyl)benzene), tris-phenol PA (4(4(1,1-bis(p-(4(4(1,1-bis(p-hydroxyphenyl)-ethyl) alpha,alpha-dimethylbenzyl)phenol), 4-chloroformyl phthalic anhydride, trimesic acid, and benzophenone tetracarboxylic acid. In one aspect, a branching agent can be added at a level of about 0.05 to about 2.0 wt %. In a still another aspect, mixtures comprising linear polycarbonates and branched polycarbonates can be used.

In another aspect, the flame retardant in the branched polycarbonate is a flame retardant salt or a cyclic siloxane or a combination of a salt and a cyclic siloxane. In another aspect, the flame retardant salt is an alkali metal salt of perfluorinated $C_{2-16}$ sulfonic acid. In yet another aspect, the flame retardant salt is potassium perfluobutane sulfonate or potassium diphenylsulfone sulfonate. In a further aspect, the cyclic siloxane is octaphenylcyclotetrasiloxane. In a yet further aspect, the flame retardant comprises a combination of potassium perfluorobutane sulfonate and octaphenylcyclotetrasiloxane.

In one aspect, the cyanophenyl endcapping groups are present in the amount about 3 to about 12 cyanophenyl carbonate units per 100 R¹ units. In another aspect, the cyanophenol group is p-cyanophenol, 3,4-dicyanophenol, or a combination comprising at least one of the foregoing phenols. In yet another aspect, the branching agent is present in an amount of about 0.75 to about 5 branching units per 100 $R^1$ units.

In one aspect, another endcapping agent can also be used with a phenol containing a cyano substituent, provided that such agent does not significantly adversely affect the desired properties of the composition, such as transparency, ductility, flame retardance, and the like. In one aspect, only a cyanophenol, specifically p-cyanophenol, is used as an endcapping agent. Exemplary additional chain stoppers include certain other mono-phenolic compounds, mono-carboxylic acid chlorides, and/or mono-chloroformates. Mono-phenolic chain stoppers are exemplified by monocyclic phenols such as phenol and $C_1$-$C_{22}$ alkyl-substituted phenols such as p-cumyl-phenol, resorcinol monobenzoate, and p- and tertiary-butyl phenol; and monoethers of diphenols, such as p-methoxyphenol.

In another aspect, an alkyl-substituted phenol with branched chain alkyl substituents having 8 to 9 carbon atoms can be used. Certain mono-phenolic UV absorbers can also be used as a capping agent, for example 4-substituted-2-hydroxybenzophenones and their derivatives, aryl salicylates, monoesters of diphenols such as resorcinol monobenzoate, 2-(2-hydroxyaryl)-benzotriazoles and their derivatives, 2-(2-hydroxyaryl)-1,3,5-triazines and their derivatives, or a combination thereof.

In one aspect, a mono-carboxylic acid chloride can also be used with a cyanophenol as a chain stopping agent. This includes a monocyclic, mono-carboxylic acid chloride such as benzoyl chloride, $C_1$-$C_{22}$ alkyl-substituted benzoyl chloride, toluoyl chloride, halogen-substituted benzoyl chloride, bromobenzoyl chloride, cinnamoyl chloride, 4-nadimidobenzoyl chloride, and a combination thereof; a polycyclic, mono-carboxylic acid chloride such as trimellitic anhydride chloride, and naphthoyl chloride; and a combination of monocyclic and polycyclic mono-carboxylic acid chlorides. In another aspect, chlorides of aliphatic monocarboxylic acids with less than or equal to about 22 carbon atoms can be used. In yet another aspect, functionalized chlorides of aliphatic monocarboxylic acids, such as acryloyl chloride and methacryoyl chloride can be used. In a further aspect, mono-chloroformates including monocyclic, mono-chloroformates, such as phenyl chloroformate, alkyl-substituted phenyl chloroformate, p-cumyl phenyl chloroformate, toluene chloroformate, and combinations thereof can be used.

In one aspect, the cyanophenyl endcapped polycarbonate can have a weight average molecular weight of about 5,000 g/mol to about 200,000 g/mol, including exemplary weight average molecular weight of about 10,000 g/mol, 15,000 g/mol, 20,000 g/mol, 25,000 g/mol, 30,000 g/mol, 35,000 g/mol, 40,000 g/mol, 45,000 g/mol, 50,000 g/mol, 55,000 g/mol, 60,000 g/mol, 65,000 g/mol, 70,000 g/mol, 75,000 g/mol, 80,000 g/mol, 85,000 g/mol, 90,000 g/mol, 95,000 g/mol, 100,000 g/mol, 105,000 g/mol, 110,000 g/mol, 115,000 g/mol, 120,000 g/mol, 125,000 g/mol, 130,000 g/mol, 135,000 g/mol, 140,000 g/mol, 145,000 g/mol, 150,000 g/mol, 155,000 g/mol, 160,000 g/mol, 165,000 g/mol, 170,000 g/mol, 175,000 g/mol, 180,000 g/mol, 185,000 g/mol, 190,000 g/mol, and about 195,000 g/mol. In another aspect, the cyanophenyl endcapped polycarbonate can have a weight average molecular weight to about 100,000 g/mol. In a further aspect, the cyanophenyl endcapped polycarbonate can have a weight average molecular weight of about 15,000 g/mol to about 60,000 g/mol. In a still further aspect, the cyanophenyl endcapped polycarbonate can have a weight average molecular weight of about 16,000 g/mol to about 45,000 grams per mole (g/mol) as measured by gel permeation chromatography (GPC), using a crosslinked styrene-divinylbenzene column and calibrated to polycarbonate references.

A non-limiting example of branched polycarbonate includes branched THPE, HBN, Endcapped PC, CFR, available from SABIC Innovative Plastics.

The branched polycarbonate component can be present in the polymer composition in any desired amount. For example, in aspects of the disclosure, the branched polycarbonate is present in an amount of at least about 5 weight % to about 20 weight % relative to the total weight of the polymer composition. For example, the branched polycarbonate can be present in an amount in the range of from about 5 weight % to about 20 weight % relative to the total weight of the polymer composition, including exemplary amounts of about 6 weight %, 7 weight %, 8 weight %, 9 weight %, 10 weight %, 11 weight %, 12 weight %, 13 weight %, 14 weight %, 15 weight %, 16 weight %, 17 weight %, 18 weight % and about 19 weight %. In still further aspects, the branched polycarbonate can can be present within any range of amounts derived from any two of the above stated values. For example, the branched polycarbonate can be present in an amount in the range of from about 10 weight % to about 20 weight %.

The disclosed laser direct structure synergist can further comprise a Talc additive.

Talc component can be present in the polymer composition in any desired amount. For example, in aspects of the disclosure, Talc is present in an amount of at least about 0.1 weight % to about 5 weight % relative to the total weight of the polymer composition. For example, Talc can be present in an amount in the range of from 0.5 weight %, about 1 weight % to about 5 weight % relative to the total weight of the polymer composition, including exemplary amounts of about 1.5 weight %, 2 weight %, 2.5 weight %, 3 weight %, 3.5 weight %, 4 weight %, and about 4.5 weight %. In still further aspects, Talc can be present within any range of amounts derived from any two of the above stated values. For example, the branched polycarbonate can be present in an amount in the range of from about 3 weight % to about 5 weight %.

E. Optional Polymer Composition Additives

The disclosed polymer composition can optionally comprise one or more additives conventionally used in the manufacture of molded polymer parts with the proviso that the optional additives do not adversely affect the desired properties of the resulting composition. Mixtures of optional additives can also be used. Such additives can be mixed at a suitable time during the mixing of the components for forming the composite mixture. For example, example, the disclosed composition can comprise one or more fillers, plasticizers, stabilizers, anti-static agents, flame-retardants, impact modifiers, colorant, antioxidant, and/or mold release agents. In one aspect, the composition further comprises one or more optional additives selected from an antioxidant, impact modifier, flame retardant, inorganic filler, and stabilizer.

Exemplary heat stabilizers include, for example, organo phosphites such as triphenyl phosphite, tris-(2,6-dimethylphenyl)phosphite, tris-(mixed mono- and di-nonylphenyl) phosphite or the like; phosphonates such as dimethylbenzene phosphonate or the like, phosphates such as trimethyl phosphate, or the like, or combinations including at least one of the foregoing heat stabilizers. Heat stabilizers are generally used in amounts of from 0.01 to 0.5 parts by weight based on 100 parts by weight of the total composition, excluding any filler.

Exemplary antioxidants include, for example, organophosphites such as tris(nonyl phenyl)phosphite, tris(2,4-di-t-butylphenyl)phosphite, bis(2,4-di-t-butylphenyl)pentaerythritol diphosphite, distearyl pentaerythritol diphosphite or the like; alkylated monophenols or polyphenols; alkylated reaction products of polyphenols with dienes, such as tetrakis[methylene(3,5-di-tert-butyl-4-hydroxyhydrocinnamate)]methane, or the like; butylated reaction products of para-cresol or dicyclopentadiene; alkylated hydroquinones; hydroxylated thiodiphenyl ethers; alkylidene-bisphenols; benzyl compounds; esters of beta-(3,5-di-tert-butyl-4-hydroxyphenyl)-propionic acid with monohydric or polyhydric alcohols; esters of beta-(5-tert-butyl-4-hydroxy-3-methylphenyl)-propionic acid with monohydric or polyhydric alcohols; esters of thioalkyl or thioaryl compounds such as distearylthiopropionate, dilaurylthiopropionate, ditridecylthiodipropionate, octadecyl-3-(3,5-di-tert-butyl-4-hydroxyphenyl)propionate, pentaerythrityl-tetrakis[3-(3,5-di-tert-butyl-4-hydroxyphenyl)propionate or the like; amides of beta-(3,5-di-tert-butyl-4-hydroxyphenyl)-propionic acid or the like, or combinations including at least one of the foregoing antioxidants. Antioxidants are generally used in amounts of from 0.01 to 0.5 parts by weight, based on 100 parts by weight of the total composition, excluding any filler.

Exemplary light stabilizers include, for example, benzotriazoles such as 2-(2-hydroxy-5-methylphenyl)benzotriazole, 2-(2-hydroxy-5-tert-octylphenyl)-benzotriazole and 2-hydroxy-4-n-octoxy benzophenone or the like or combinations including at least one of the foregoing light stabilizers. Light stabilizers are generally used in amounts of from 0.1 to 1.0 parts by weight, based on 100 parts by weight of the total composition, excluding any filler.

Exemplary plasticizers include, for example, phthalic acid esters such as dioctyl-dioctyl-4,5-epoxy-hexahydrophthalate, tris-(octoxycarbonylethyl)isocyanurate, tristearin, epoxidized soybean oil or the like, or combinations including at least one of the foregoing plasticizers. Plasticizers are generally used in amounts of from 0.5 to 3.0 parts by weight, based on 100 parts by weight of the total composition, excluding any filler.

Exemplary antistatic agents include, for example, glycerol monostearate, sodium stearyl sulfonate, sodium dodecylbenzenesulfonate or the like, or combinations of the foregoing antistatic agents. In one aspect, carbon fibers, carbon nanofibers, carbon nanotubes, carbon black, or any combination of the foregoing can be used in a polymeric resin containing chemical antistatic agents to render the composition electrostatically dissipative.

Exemplary mold releasing agents include for example, metal stearate, stearyl stearate, pentaerythritol tetrastearate, beeswax, montan wax, paraffin wax, or the like, or combinations including at least one of the foregoing mold release agents. Mold releasing agents are generally used in amounts of from 0.1 to 1.0 parts by weight, based on 100 parts by weight of the total composition, excluding any filler.

Exemplary UV absorbers include for example, hydroxybenzophenones; hydroxybenzotriazoles; hydroxybenzotriazines; cyanoacrylates; oxanilides; benzoxazinones; 2-(2H-benzotriazol-2-yl)-4-(1,1,3,3-tetramethylbutyl)-phenol (CYASORB™ 5411); 2-hydroxy-4-n-octyloxybenzophenone (CYASORB™ 531); 2-[4,6-bis(2,4-dimethylphenyl)-1,3,5-triazin-2-yl]-5-(octyloxy)-phenol (CYASORB™ 1164); 2,2'-(1,4-phenylene)bis(4H-3,1-benzoxazin-4-one) (CYASORB™ UV-3638); 1,3-bis[(2-cyano-3,3-diphenylacryloyl)oxy]-2,2-bis[[(2-cyano-3,3-diphenylacryloyl)oxy]methyl]propane (UVINUL™ 3030); 2,2'-(1,4-phenylene)bis(4H-3,1-benzoxazin-4-one); 1,3-bis[(2-cyano-3,3-diphenylacryloyl)oxy]-2,2-bis[[(2-cyano-3,3-diphenylacryloyl)oxy]methyl]propane; nano-size inorganic materials such as titanium oxide, cerium oxide, and zinc oxide, all with particle size less than 100 nanometers; or the like, or combinations including at least one of the foregoing UV absorbers. UV absorbers are generally used in amounts of from 0.01 to 3.0 parts by weight, based on 100 parts by weight of the total composition, excluding any filler.

Exemplary lubricants include for example, fatty acid esters such as alkyl stearyl esters, e.g., methyl stearate or the like; mixtures of methyl stearate and hydrophilic and hydrophobic surfactants including polyethylene glycol polymers, polypropylene glycol polymers, and copolymers thereof e.g., methyl stearate and polyethylene-polypropylene glycol copolymers in a suitable solvent; or combinations including at least one of the foregoing lubricants. Lubricants are generally used in amounts of from 0.1 to 5 parts by weight, based on 100 parts by weight of the total composition, excluding any filler.

Exemplary blowing agents include for example, low boiling halohydrocarbons and those that generate carbon dioxide; blowing agents that are solid at room temperature and when heated to temperatures higher than their decomposition temperature, generate gases such as nitrogen, carbon dioxide, ammonia gas, such as azodicarbonamide, metal salts of azodicarbonamide, 4,4' oxybis(benzenesulfonylhydrazide), sodium bicarbonate, ammonium carbonate, or the like, or combinations including at least one of the foregoing blowing agents. Blowing agents are generally used in amounts of from 1 to 20 parts by weight, based on 100 parts by weight of the total composition, excluding any filler.

Exemplary impact modifier of the present invention include but not limited to, for example, an acrylonitrile-butadiene-styrene polymer (ABS), an acrylonitrile-styrene-butyl acrylate (ASA) polymer, a methyl methacrylate-acrylonitrile-butadiene-styrene (MABS) polymer, a methyl methacrylate-butadiene-styrene (MBS) polymer, and an acrylonitrile-ethylene-propylene-diene-styrene (AES) polymer. In a still further aspect, the impact modifier is an acrylonitrile-butadiene-styrene polymer ("ABS polymer"). In a still further aspect, a suitable impact modifier is a bulk polymerized ABS polymer ("BABS polymer" or "Bulk ABS polymer").

As noted above, the disclosed polymer composition can optionally further comprises a flame retardant additive. In various aspects, the flame retardant additive can comprise any flame retardant material or mixture of flame retardant materials suitable for use in the inventive polymer composition. In another aspect, the flame retardant additive comprises a phosphate containing material. In another aspect, the flame retardant additive comprises a halogen containing material.

In one aspect, a flame retardant additive includes, for example, flame retardant salts such as alkali metal salts of perfluorinated $C_{1-6}$ alkyl sulfonates such as potassium perfluorobutane sulfonate (Rimar salt), potassium perfluorooctane sulfonate, tetraethylammonium perfluorohexane sulfonate, potassium diphenylsulfone sulfonate (KSS), and the like; and salts formed by reacting for example an alkali metal or alkaline earth metal (for example lithium, sodium, potassium, magnesium, calcium and barium salts) and an inorganic acid complex salt, for example, an oxo-anion, such as alkali metal and alkaline-alkaline-earth metal salts of carbonic acid, such as $Na_2CO_3$, $K_2CO_3$, $MgCO_3$, $CaCO_3$, and $BaCO_3$ or fluoro-anion complex such as $Li_3AlF_6$, $BaSiF_6$, $KBF_4$, $K_3AlF_6$, $KAlF_4$, $K_2SiF_6$, and/or $Na_3AlF_6$ or the like. Rimar salt and KSS, alone or in combination with other flame retardants, are particularly useful in the polycarbonate compositions disclosed herein.

In another aspect, a flame retardant additive can also include organic compounds that include phosphorus, bromine, and/or chlorine. Non-brominated and non-chlorinated phosphorus-containing flame retardants can be used in certain applications for regulatory reasons, for example organic phosphates and organic compounds containing phosphorus-nitrogen bonds. One type of exemplary organic phosphate is an aromatic phosphate of the formula $(GO)_3P=O$, wherein each G is independently an alkyl, cycloalkyl, aryl, alkylaryl, or arylalkyl group, provided that at least one G is an aromatic group. Two of the G groups can be joined together to provide a cyclic group, for example, diphenyl pentaerythritol diphosphate. Exemplary aromatic phosphates include, phenyl bis(dodecyl)phosphate, phenyl bis(neopentyl)phosphate, phenyl bis(3,5,5'-trimethylhexyl)phosphate, ethyl diphenyl phosphate, 2-ethylhexyl di(p-tolyl)phosphate, bis (2-ethylhexyl)p-tolyl phosphate, tritolyl phosphate, bis(2-ethylhexyl)phenyl phosphate, tri(nonylphenyl)phosphate, bis(dodecyl)p-tolyl phosphate, dibutyl phenyl phosphate, 2-chloroethyl diphenyl phosphate, p-tolyl bis(2,5,5'-trimethylhexyl)phosphate, 2-ethylhexyl diphenyl phosphate, or the like. A specific aromatic phosphate is one in which each G is aromatic, for example, triphenyl phosphate, tricresyl phosphate, isopropylated triphenyl phosphate, and the like.

In other aspects, the flame retardant additive is free of or substantially free of one or more of phosphate and/or a halogen. In still another aspect, the flame retardant additive comprises an oligomer organophosphorous flame retardant, including for example, bisphenol A diphenyl phosphate (BPADP). In a further aspect, the flame retardant is selected from oligomeric phosphate, polymeric phosphate, oligomeric phosphonate, or mixed phosphate/phosphonate ester flame retardant composition. In a still further aspect, the flame retardant is selected from triphenyl phosphate; cresyldiphenylphosphate; tri(isopropylphenyl)phosphate; resorcinol bis(diphenylphosphate); and bisphenol-A bis(diphenyl phosphate). In a yet further aspect, the flame retardant is bisphenol-A bis(diphenyl phosphate).

The concentration of a flame retardant additive can vary, and the present invention is not intended to be limited to any particular flame retardant concentration. In one aspect, the disclosed composition can comprises from greater than 0 weight % to about 20 weight % of flame retardant additive, including or example, about 1 weight %, 2 weight %, 3 weight %, 4 weight %, 5 weight %, 6 weight %, 7 weight %, 8 weight %, 9 weight %, 10 weight %, 11 weight %, 12 weight %, 13 weight %, 14 weight %, 15 weight %, 16 weight %, 17 weight %, 18 weight %, or 19 weight %. In still further aspects, the flame retardant additive can be present in any range of amounts derived from the above values. For example, the flame retardant additive can be present in the polycarbonate composition in an amount in the range of from about 5 weight % to about 15 weight %, or event from about 10 weight % to about 20 weight %. Flame retardant additives are commercially available, and one of skill in the art could readily select an appropriate flame retardant additive.

Additionally, materials to improve flow and other properties can be added to the composition, such as low molecular weight hydrocarbon resins. Particularly useful classes of low molecular weight hydrocarbon resins are those derived from petroleum $C_5$ to $C_9$ feedstock that are derived from unsaturated $C_5$ to $C_9$ monomers obtained from petroleum cracking. Non-limiting examples include olefins, e.g. pentenes, hexenes, heptenes and the like; diolefins, e.g. pentadienes, hexadienes and the like; cyclic olefins and diolefins, e.g. cyclopentene, cyclopentadiene, cyclohexene, cyclohexadiene, methyl cyclopentadiene and the like; cyclic diolefin dienes, e.g., dicyclopentadiene, methylcyclopentadiene dimer and the like; and aromatic hydrocarbons, e.g. vinyltoluenes, indenes, methylindenes and the like. The resins can additionally be partially or fully hydrogenated.

In aspect, the disclosed polymer composition is capable of being activated by a laser. In another aspect, the disclosed polymer composition is capable of being molded into an article.

II. Methods of Manufacture

In a further aspect, the invention relates to a method for making a polymer composition, the method comprising forming a blend composition comprising: (a) a polycarbonate polymer; (b) a laser direct structuring additive; (c) a reinforcing filler; and (d) a laser direct structuring synergist that does not comprise a substantially linear polycarbonate polymer, and wherein the polymer composition is capable of being plated after being activated using a laser In one aspect, the laser direct structuring process involves three steps: 1) injection molding, 2) laser structuring, and 3) metallizing.

In a further aspect, during the injection molding step, the laser direct structuring additive and laser direct structuring synergist can be mixed with the polycarbonate polymer and reinforcing filler. In another aspect, the blend composition further comprises one or more optional additives selected from an antioxidant, impact modifier, flame retardant, inorganic filler, and stabilizer. In a still further aspect, single shot injection molding can be used to produce the parts or articles to be laser structured. In at least one aspect, the polymer composition can be mixed at this step and used in the LDS process. In another aspect, additional ingredients can be added to the polymer composition after this step.

As described herein, the present invention relates to a blended polymer composition. The blended polymer composition of the present disclosure can be formed using any known method of combining multiple components to form a polymer resin. In one aspect, the components are first blended in a high-speed mixer. Other low shear processes including but not limited to hand mixing can also accomplish this blending. The blend is then fed into the throat of a twin-screw extruder via a hopper. Alternatively, one or more of the components can be incorporated into the composition by feeding directly into the extruder at the throat and/or downstream through a sidestuffer. The extruder is generally operated at a temperature higher than that necessary to cause the composition to flow. The extrudate is immediately quenched in a water batch and pelletized. The pellets so prepared when cutting the extrudate can be one-fourth inch long or less as desired. Such pellets can be used for subsequent molding, shaping, or forming. In one aspect, the blend composition is formed by extrusion blending.

In a further aspect, during the laser structuring step, a laser is used to form a conductive path during the laser structuring step. In a still further aspect, the laser used to form a conductive path is laser direct structuring. In a yet further aspect, laser direct structuring comprises laser etching. In an even further aspect, laser etching is carried out to provide an activated surface.

In a further aspect, at least one laser beam draws at least one pattern on the surface of the polymer composition during the laser structuring step. In a still further aspect, the employed filler composition can release at least one metallic nucleus. In a yet further aspect, the at least one metallic nucleus that has been released can act as a catalyst for reductive copper plating process.

In a further aspect, laser etching is carried out at a broad window of the laser parameters at about 1 W to about 10 W power with a frequency from about 30 kHz to about 110 kHz and a speed of about 1 m/s to about 5 m/s. In a still further aspect, laser etching is carried out at about 1 W to about 10 W power with a frequency from about 40 kHz to about 100 kHz and a speed of about 2 m/s to about 4 m/s.

In a further aspect, a rough surface can form in the LDS process. In a still further aspect, the rough surface can entangle the copper plate with the polymer matrix in the polymer composition, which can provide adhesion between the copper plate and the polymer composition.

The metalizing step can, in various aspects, be performed using conventional techniques. For example, in one aspect, an electroless copper plating bath is used during the metallization step in the LDS process. Thus, in various aspects, plating a metal layer onto a conductive path is metallization. In a still further aspect, metallization can comprise the steps: a) cleaning the etched surface; b) additive build-up of tracks; and c) plating.

In a further aspect, the method comprises making a polymer composition wherein a molded article formed from the composition demonstrates a flexural modulus that can be in the range of from about 1.0 GPa to about 10.0 GPa. In a further aspect of the disclosure, a molded article formed from the disclosed polymer composition exhibits a flexural modulus of at least about 3 GPa. In yet another aspect, a molded article formed from the disclosed polymer composition exhibits a flexural modulus of at least about 3 GPa to about 10 GPa, including exemplary values of about 3.1 GPa, 3.2 GPa, 3.3 GPa, 3.4 GPa, 3.5 GPa, 3.6 GPa, 3.7 GPa, 3.8 Gpa, 3.9 GPa, 4.0 GPa, 4.1 GPa, 4.2 GPa, 4.3 GPa, 4.4 GPa, 4.5 GPa, 4.6 GPa, 4.7 GPa, 4.8 GPa, 4.9 GPa, 5.0 GPa, 5.1 GPa, 5.2 GPa, 5.3 GPa, 5.4 GPa, 5.5 GPa, 5.6 GPa, 5.7 GPa, 5.8 GPa, 5.9 GPa, 6.0 GPa, 6.1 GPa, 6.2 GPa, 6.3 GPa, 6.4 GPa, 6.5 GPa, 6.6 GPa, 6.7 GPa, 6.8 GPa, 6.9 GPa, 7.0 GPa, 7.1 GPa, 7.2 GPa, 7.3 GPa, 7.4 GPa, 7.5 GPa, 7.6 GPa, 7.7 GPa, 7.8 GPa, 7.9 GPa, 8.0 GPa, 8.1 GPa, 8.2 GPa, 8.3 GPa, 8.4 GPa, 8.5 GPa, 8.6 GPa, 8.7 GPa, 8.8 GPa, 8.9 GPa, 9.0 GPa, 9.1 GPa, 9.2 GPa, 9.3 GPa, 9.4 GPa, 9.5 GPa, 9.6 GPa, 9.7 GPa, 9.8 GPa, and 9.9 GPa. In another aspect, the flexural modulus can be in any range derived from any two of the above flexural modulus values. For example, the flexural modulus can be in the range of from about 7.0 GPa to about 9.0 GPa. In a still further aspect, the flexural modulus can be in the range of from about 7.1 GPa to about 8.9 GPa.

In still further aspect, the method comprises making a polymer composition wherein a molded article formed from the composition demonstrates a tensile modulus in an amount equal from about 1.0 GPa to about 10.0 GPa. In a further aspect of the disclosure, a molded article formed from the disclosed polymer composition exhibits a tensile modulus of at least about 3 GPa. In yet another aspect, a molded article formed from the disclosed polymer composition exhibits a tensile modulus least about 3 GPa to about 10 GPa, including exemplary values of about 3.1 GPa, 3.2 GPa, 3.3 GPa, 3.4 GPa, 3.5 GPa, 3.6 GPa, 3.7 GPa, 3.8 Gpa, 3.9 GPa, 4.0 GPa, 4.1 GPa, 4.2 GPa, 4.3 GPa, 4.4 GPa, 4.5 GPa, 4.6 GPa, 4.7 GPa, 4.8 GPa, 4.9 GPa, 5.0 GPa, 5.1 GPa, 5.2 GPa, 5.3 GPa, 5.4 GPa, 5.5 GPa, 5.6 GPa, 5.7 GPa, 5.8 GPa, 5.9 GPa, 6.0 GPa, 6.1 GPa, 6.2 GPa, 6.3 GPa, 6.4 GPa, 6.5 GPa, 6.6 GPa, 6.7 GPa, 6.8 GPa, 6.9 GPa, 7.0 GPa, 7.1 GPa, 7.2 GPa, 7.3 GPa, 7.4 GPa, 7.5 GPa, 7.6 GPa, 7.7 GPa, 7.8 GPa, 7.9 GPa, 8.0 GPa, 8.1 GPa, 8.2 GPa, 8.3 GPa, 8.4 GPa, 8.5 GPa, 8.6 GPa, 8.7 GPa, 8.8 GPa, 8.9 GPa, 9.0 GPa, 9.1 GPa, 9.2 GPa, 9.3 GPa, 9.4 GPa, 9.5 GPa, 9.6 GPa, 9.7 GPa, 9.8 GPa, and 9.9 GPa. In another aspect, the tensile modulus can be in any range derived from any two of the above tensile modulus values. For example, the tensile modulus can be in the range of from about 7.0 GPa to about 9.0 GPa. In a still further aspect, the tensile modulus can be in the range of from about 7.1 GPa to about 8.9 GPa.

In one aspect, the method for making the polymer composition comprising forming a polymer composition comprising: (a) a polycarbonate polymer; (b) a laser direct structuring additive; (c) a reinforcing filler; and (d) a laser direct structuring synergist, wherein the laser direct structuring synergist does not comprise a substantially linear polycarbonate polymer; and wherein the polymer composition is capable of being plated after being activated using a laser.

In one aspect, the polycarbonate polymer, in step (a), comprises a bisphenol A polycarbonate polymer. In a yet further aspect, the bisphenol A polycarbonate polymer comprises a blend of at least two different bisphenol A polycarbonate.

In another aspect, the polycarbonate polymer, in step (a), is provided in an amount in the range from about 10 weight % up to about 90 weight % relative to the total weight of the polymer composition, including further exemplary amounts of about 15 weight %, 20 weight %, 25 weight %, 30 weight %, 35 weight %, 40 weight %, 45 weight %, 50 weight %, 55 weight %, 60 weight %, 65 weight %, 70 weight %, 75 weight %, 80 weight %, and about 85 weight %.

In another aspect, the laser direct structuring additive comprises a heavy metal mixture oxide spine, a copper salt, or a combination thereof. In a yet further aspect, the heavy metal mixture oxide spinel comprises a copper chromium oxide spinel. In an even further aspect, the copper salt comprises a copper hydroxide phosphate.

In another aspect, the laser direct structuring additive, in step (b), is provided in an amount in the range great than about zero to about 15 weight % relative to the total weight of the polymer composition, including for example, amounts of about 1 weight %, about 2 weight %, about 3 weight %, about 4 weight %, about 5 weight %, about 6 weight %, about 7 weight %, about 8 weight %, about 9 weight %, about 10 weight %, about 11 weight %, about 12 weight %, about 13 weight %, and about 14 weight %. In still further aspects, the laser direct structure (LDS) additive can be present in the polymer composition in an amount within any range of amounts derived from any two of the above stated values. For example, the laser direct structuring additive can be present in an amount of from about 1 weight % to about 10 weight % relative to the total weight of the polymer composition. In an even further aspect, the laser direct structuring additive can be present in the polymer composition in an amount of about 1 weight % to about 7 weight % relative to the total weight of the polymer composition, or about 3 weight % relative to the total weight of the polymer composition. In a yet further aspect, the LDS additive can be present in the polymer composition in an amount of about 6 weight % relative to the total weight of the polymer composition.

In one aspect, the reinforcing filler, in step (c), comprises a glass fiber, a mineral filler, or a carbon fiber, or a combination thereof. In another aspect, the reinforcing filler is a glass fiber. In yet another aspect, the reinforcing fiber, is provided in an amount in the range from about 5 weight % to about 60 weight % relative to the total weight of the polymer composition, including further exemplary amounts of 10 weight %, 15 weight %, 20 weight %, 25 weight %, 30 weight %, 35 weight %, 40 weight %, 45 weight %, 50 weight %, and 55 weight %.

In one aspect, the laser direct structuring synergist, in step (d), is provided in the range from about 1 weight % to about 20 weight % relative to the total weight of the polymer composition, including further exemplary amounts of 2 weight %, 3 weight %, 4 weight %, 5 weight %, 6 weight %, 7 weight %, 8 weight %, 9 weight %, 10 weight %, 11 weight %, 12 weight %, 13 weight %, 14 weight %, 15 weight %, 16 weight %, 17 weight %, 18 weight %, and 19 weight %. In another aspect, the laser direct structuring synergist comprises a polycarbonate-polysiloxane copolymer, branched polycarbonate, or Talc, or a combination thereof. In yet another aspect, the laser direct structuring synergist does not comprise a substantially linear polycarbonate polymer. In a further aspect, the polycarbonate-polycarbonate-polysiloxane copolymer is provided in an amount in the range from about 5 weight % to about 20 weight % to the total weight of the polymer composition. In a yet further aspect, the branched polycarbonate is provided in amount in the range from about 5 weight % to about 20 weight % relative to the total weight of the polymer composition. In an even further aspect, Talc is provided in an amount in the range from about 1 weight % to about 5 weight % relative to the total weight of the polymer composition.

In still further aspects, disclosed herein a method for making a polymer composition, wherein, a molded article formed from the disclosed polymer composition is capable of having an enhanced plating efficiency in a broad window of the laser parameters. In another aspect, disclosed herein the method for making a polymer composition, wherein a molded article formed from the disclosed polymer composition can exhibit desirable value of a plating index. For example, according to aspects, a molded article formed from the disclosed polymer composition can exhibit a plating index in the range of from about 0.70 to about 1.50.

In one aspect, disclosed herein a method for making a polymer composition, wherein the polymer composition is capable of having an enhanced plating efficiency of at least about 2% to about 75% relatively to a substantially identical reference composition in the absence of the laser direct structuring synergist. For example, according to aspects, a molded article formed from the disclosed polymer composition is capable of having an enhanced plating efficiency of in the range of from about 2% to about 50%, including exemplary values of about 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, and about 49% relatively to a substantially identical reference composition in the absence of the laser direct structuring synergist. In still further aspects, an enhanced plating efficiency can be in a range derived from any two of the above listed exemplary plating efficiencies. For example, the enhanced plating efficiency can be in the range of from about 9% to about 30% relatively to a substantially identical reference composition in the absence of the laser direct structuring synergist.

In one aspect, disclosed herein a method for making a polymer composition, wherein a molded article formed from the disclosed polymer composition is capable of having an enhanced plating efficiency in a broad window of the laser parameters with a statistical variance of at least about 2% to about 75% lower than that measured for a substantially identical reference composition in the absence of a laser direct structuring synergist. In another aspect, a molded article formed from the disclosed polymer composition can exhibit plating index values with the statistical variance of in the range of from about 2% to about 50%, including exemplary values of about 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, and about 49% lower than that measured for a substantially identical reference composition in the absence of a laser direct structuring synergist. In still further aspects, the statistical variance can be in a range derived from any two of the above listed exemplary statistical variances. For example, the statistical variance can be in the range of from about 9% to about 30%.

III. Articles of Manufacture

A shaped, formed, or molded article including the polymer composition is also provided. The polymer composition can be molded into useful shaped articles by a variety of means such as injection molding, extrusion, rotational molding, blow molding and thermoforming to form articles such as, for example, personal computers, notebook and portable computers, cell phone antennas and other such communications equipment, medical applications, RFID applications, automotive applications, and the like.

The blended polymer composition disclosed herein provides robust plating performance while maintaining good mechanical properties, for example, a tensile modulus can be in the range of from about 1.0 GPa to about 10.0 GPa. In a further aspect of the disclosure, a molded article formed from the disclosed polymer composition exhibits tensile modulus of at least about 3 GPa. In yet another aspect, a molded article formed from the disclosed polymer composition exhibits tensile modulus least about 3 GPa to about 10 GPa, including exemplary values of about 3.1 GPa, 3.2 GPa, 3.3 GPa, 3.4 GPa, 3.5 GPa, 3.6 GPa, 3.7 GPa, 3.8 Gpa, 3.9 GPa, 4.0 GPa, 4.1 GPa, 4.2 GPa, 4.3 GPa, 4.4 GPa, 4.5 GPa, 4.6 GPa, 4.7 GPa, 4.8 GPa, 4.9 GPa, 5.0 GPa, 5.1 GPa, 5.2 GPa, 5.3 GPa, 5.4 GPa, 5.5 GPa, 5.6 GPa, 5.7 GPa, 5.8 GPa, 5.9 GPa, 6.0 GPa, 6.1 GPa, 6.2 GPa, 6.3 GPa, 6.4 GPa, 6.5 GPa, 6.6 GPa, 6.7 GPa, 6.8 GPa, 6.9 GPa, 7.0 GPa, 7.1 GPa, 7.2 GPa, 7.3 GPa, 7.4 GPa, 7.5 GPa, 7.6 GPa, 7.7 GPa, 7.8 GPa, 7.9 GPa, 8.0 GPa, 8.1 GPa, 8.2 GPa, 8.3 GPa, 8.4 GPa, 8.5 GPa, 8.6 GPa, 8.7 GPa, 8.8 GPa, 8.9 GPa, 9.0 GPa, 9.1 GPa, 9.2 GPa, 9.3 GPa, 9.4 GPa, 9.5 GPa, 9.6 GPa, 9.7 GPa, 9.8 GPa, and 9.9 GPa. In another aspect, the tensile modulus can be in any range derived from any two of the above tensile modulus values. For example, the tensile modulus can be in the range of from about 7.0 GPa to about 9.0 GPa. In a still further aspect, aspect, the tensile modulus can be in the range of from about 7.1 GPa to about 8.9 GPa.

In another aspect, the blended polymer composition disclosed herein provides robust plating performance while maintaining good mechanical properties, for example, a flexural modulus can be in the range of from about 1.0 GPa to about 10.0 GPa. In a further aspect of the disclosure, a molded article formed from the disclosed polymer composition exhibits a flexural modulus of at least about 3 GPa. In yet another aspect, a molded article formed from the disclosed polymer composition exhibits a flexural modulus of at least about 3 GPa to about 10 GPa, including exemplary values of about 3.1 GPa, 3.2 GPa, 3.3 GPa, 3.4 GPa, 3.5 GPa, 3.6 GPa, 3.7 GPa, 3.8 Gpa, 3.9 GPa, 4.0 GPa, 4.1 GPa, 4.2 GPa, 4.3 GPa, 4.4 GPa, 4.5 GPa, 4.6 GPa, 4.7 GPa, 4.8 GPa, 4.9 GPa, 5.0 GPa, 5.1 GPa, 5.2 GPa, 5.3 GPa, 5.4 GPa, 5.5 GPa, 5.6 GPa, 5.7 GPa, 5.8 GPa, 5.9 GPa, 6.0 GPa, 6.1 GPa, 6.2 GPa, 6.3 GPa, 6.4 GPa, 6.5 GPa, 6.6 GPa, 6.7 GPa, 6.8 GPa, 6.9 GPa, 7.0 GPa, 7.1 GPa, 7.2 GPa, 7.3 GPa, 7.4 GPa, 7.5 GPa, 7.6 GPa, 7.7 GPa, 7.8 GPa, 7.9 GPa, 8.0 GPa, 8.1 GPa, 8.2 GPa, 8.3 GPa, 8.4 GPa, 8.5 GPa, 8.6 GPa, 8.7 GPa, 8.8 GPa, 8.9 GPa, 9.0 GPa, 9.1 GPa, 9.2 GPa, 9.3 GPa, 9.4 GPa, 9.5 GPa, 9.6 GPa, 9.7 GPa, 9.8 GPa, and 9.9 GPa. In another aspect, the flexural modulus can be in any range derived from any two of the above flexural modulus values. For example, the flexural modulus can be in the range of from about 7.0 GPa to about 9.0 GPa. In a still further aspect, the flexural modulus can be in the range of from about 7.1 GPa to about 8.9 GPa.

Evaluation of the mechanical properties can be performed through various tests according to several standards, e.g., ASTM D790, ASTM D 638, ASTM D256, ASTM D 1238, ASTM D 4812, ASTM D 648, etc. Robustness of plating performance can be measured via a performance ranking, or plating ranking, ranging from top performance (e.g., "best") to bottom performance. The ranking can be partitioned in various levels. In one aspect, a plating ranking can have a level of "10" for top performance and a level of "0" for bottom performance.

In a further aspect, the method comprises forming a molded part from the formed blend composition. In another aspect, the method further comprises subjecting the molded part to a laser direct structuring process.

In several aspects, the LDS compound comprises a fixed loading amount of an LDS additive, such as copper chromium oxide, and varying amounts of polymer base resins. In such aspects, fixed loading amounts of a stabilizer, an antioxidant, or a mold release agent can be maintained in the LDS compounds.

In one aspect, the article comprises the product of extrusion molding or injection molding a composition comprising: (a) a polycarbonate polymer; (b) a laser direct structuring additive; (c) a reinforcing filler; and (d) a laser direct structuring synergist that does not comprise a substantially linear polycarbonate polymer, and wherein the polymer composition is capable of being plated after being activated using a laser.

In a further aspect, the molded article further comprises a conductive path formed by activation with a laser. In a yet further aspect, the article further comprises a metal layer plated onto the conductive path. In an even further aspect, the metal layer is a copper layer. In a still further aspect, the metal layer has a thickness of about 0.8 micrometers or higher as measured according to ASTM B568.

In various aspects, the polymer composition can be used in the field of electronics. In a further aspect, non-limiting examples of fields which can use 3D MID, LDS process, or a polymer composition include electrical, electro-mechanical, Radio Frequency (RF) technology, telecommunication, automotive, aviation, medical, sensor, military, and security. In a still further aspect, the use of 3D MID, LDS process, or a polymer composition can also be present in overlapping fields, for example in mechatronic systems that integrate mechanical and electrical properties which can, for example, be used in automotive or medical engineering.

In one aspect, a molded article according to the present invention can be used to produce a device in one or more of the foregoing fields. In a still further aspect, non-limiting examples of such devices in these fields which can use 3D MID, LDS process, or a polymer composition according to the present invention include a computer device, a household appliance, a decoration device, an electromagnetic interference device, a printed circuit, a Wi-Fi device, a Bluetooth device, a GPS device, a cellular antenna device, a smart phone device, an automotive device, a military device, an aerospace device, a medical device, such as a hearing aid, a sensor device, a security device, a shielding device, a RF antenna device, or a RFID device.

In a still further aspect, the molded article can be used to manufacture devices in the automotive field. In a further aspect, non-limiting examples of such devices in the automotive field which can use 3D MID, LDS process, or the disclosed polymer composition in the vehicle's interior include adaptive cruise control, headlight sensors, windshield wiper sensors, and door/window switches. In a further aspect, non-limiting examples of devices in the automotive field which can use 3D MID, LDS process, or the disclosed polymer composition in the vehicle's exterior include a pressure and flow sensor for engine management, air conditioning, crash detection, and an exterior lighting fixture.

Plastic plating was developed for industrial application because of the low cost, the ability to mold large and complex parts, and the reduction of weight. Plastic plating also allows the rapid development of new designs and reduced space requirements in both production and the devices themselves. As gasoline prices rise, consumers have become more interested in automotive weight reduction. Non-limiting examples of plastic materials which can be plated include acrylonitrile butadiene styrene (ABS), polypropylene, polysulfone, polyethersulfone, polyetherimide, Teflon, polyarylether, polycarbonate, polyphenylene oxide, polyacetel. The LDS process can be used for plastic plating and the plastic material can be included in the polymer composition or in the polymer matrix of the polymer composition.

In one aspect, the molded article can have a thickness ranging from 1.2 mm to 2.0 mm. For example, the molded article can have a thickness of 1.6 mm. In further aspect, the molded article can have a thickness ranging from 2.8 to 3.5 mm. For example, the molded article can have a thickness of 3.2 mm.

In a further aspect, the resulting disclosed composition can be used to provide any desired shaped, formed, or molded article. For example, the disclosed composition can be molded into useful shaped article by a variety of means such as injection molding, extrusion, rotational molding, blow molding and thermoforming. As noted above, the disclosed composition is well suited for use in the manufacture of electronic components and devices. As such, according to some aspects, the disclosed composition can be used to form articles such as a printed circuit board carrier, a burn in test socket, a flex bracket for a hard disk drive, and the like.

The disclosed methods include at least the following aspects.

The present invention relates to conductive thermoplastic resin compositions having usefulness electronic applications.

Aspect 1: A polymer composition comprising:
a. a polycarbonate polymer;
b. a laser direct structuring additive capable of being activated by electromagnetic radiation and thereby forming elemental metal nuclei;
c. a reinforcing filler; and d. a laser direct structuring synergist, wherein the laser direct structuring synergist does not comprise a substantially linear polycarbonate; and wherein the polymer composition is capable of being plated after being activated using a laser.

Aspect 2: The polymer composition of aspect 1, wherein the polycarbonate polymer is present in an amount in the range from about 10 weight % to about 90 weight % relative to the total weight of the polymer composition.

Aspect 3: The polymer composition of any one of aspects 1-2, wherein the laser direct structuring additive is present in an amount in the range from about 1 weight % to about 10 weight % relative to the total weight of the polymer composition.

Aspect 4: The polymer composition of any one of aspects 1-3, wherein the laser direct structuring additive comprises a heavy metal mixture oxide spinel, a copper salt, or a combination thereof.

Aspect 5: The polymer composition aspect 4, wherein the heavy metal mixture oxide spinel comprises a copper chromium oxide spinel.

Aspect 6: The polymer composition of aspect 4, wherein a copper salt comprises a copper hydroxide phosphate.

Aspect 7: The polymer composition of any one of aspects 1-6, wherein the reinforcing filler is present in an amount in the range from about 5 weight % to about 60 weight % relative to the total weight of the polymer composition.

Aspect 8: The polymer composition of any one of aspects 1-7, wherein the reinforcing filler comprises a glass fiber, a mineral filler, a carbon fiber, or a combination thereof.

Aspect 9: The polymer composition of aspect 8, wherein the reinforcing filler is a glass fiber.

Aspect 10: The polymer composition of any one of aspects 1-9, wherein the laser direct structuring synergist is present in an amount in the range from about 1 weight % to about 20 weight % relative to the total weight of the polymer composition.

Aspect 11: The polymer composition of any one of aspects 1-10, wherein the laser direct structuring synergist comprises a poycarbonate-polysiloxane copolymer, a branched polycarbonate, or Talc, or a combination thereof.

Aspect 12: The polymer composition of aspect 11, wherein the polycarbonate-polysiloxane is present in an amount in the range of from about 5 weight % to about 20 weight % relative to the total weight of the polymer composition.

Aspect 13: The polymer composition of aspect 11, wherein the branched polycarbonate is present in an amount in the range from about 5 weight % to about 20 weight % relative to the total weight of the polymer composition.

Aspect 14: The polymer composition of aspect 11, wherein Talc is present in an amount in the range from about 1 weight % to about 5 weight % relative to the total weight of the polymer composition.

Aspect 15: The polymer composition of any one of aspects 1-14, further comprising one or more additional additives selected from an antioxidant, impact modifier, flame retardant, inorganic filler, and stabilizer.

Aspect 16: The polymer composition of any one of aspects 1-15, wherein the polymer composition is capable of being molded into an article.

Aspect 17: The polymer composition of any one of aspects 1-16, wherein the polymer composition demonstrates a flexural modulus in an amount equal or great than about 3 GPa.

Aspect 18: The polymer composition of any one of aspects 1-16, wherein the polymer composition demonstrates a tensile modulus in an amount equal or great than about 3 GPa.

Aspect 19: The polymer composition of any one of aspects 1-18, wherein the polymer composition is having an enhanced plating efficiency by at least about 2% relatively to a substantially identical reference composition in the absence of the laser direct structuring synergist.

Aspect 20: The polymer composition of any one of aspects 1-19, wherein the polymer composition is capable of having an enhanced plating efficiency in a broad window of the laser parameters.

Aspect 21: The polymer composition of any one of aspects 1-20, wherein the polymer composition is capable of having a plating index value with a statistical variance of at least about 2 to about 75% lower than that measured for a substantially identical reference composition in the absence of the laser structuring synergist.

Aspect 22: The polymer composition of any one of aspects 1-20, wherein the polymer composition is capable of having a plating index value with a statistical variance of at least about 9 to about 30% lower than that measured for a substantially identical reference composition in the absence of the laser structuring synergist.

Aspect 23: A method for making a polymer composition; comprising forming a blend composition comprising:
a. a polycarbonate polymer;
b. a laser structuring additive capable of being activated by electromagnetic radiation and thereby forming elemental metal nuclei;
c. a reinforcing filler; and
d. a laser structuring synergist wherein the laser direct structuring synergist does not comprise a substantially linear polycarbonate; and
wherein the polymer composition is capable of being plated after being activated using a laser.

Aspect 24: The method of aspect 23, wherein the polycarbonate polymer is provided in an amount in the range from about 10 weight % to about 90 weight % relative to the total weight of the polymer composition.

Aspect 25: The method of any one of aspects 23-24, wherein the polycarbonate polymer comprises a bisphenol A polycarbonate.

Aspect 26: The method of aspect 25, wherein the bisphenol A polycarbonate comprises a blend of at least two different bisphenol A polycarbonates.

Aspect 27: The method of any one of aspects 23-26, wherein the laser direct structuring additive is provided in an amount in the range from about 1 weight % to about 10 weight % relative to the total weight of the polymer composition.

Aspect 28: The method of any one of aspects 23-27, wherein the laser direct structuring additive comprises a heavy metal mixture oxide spinel, a copper salt, or a combination thereof.

Aspect 29: The method of aspect 28, wherein the heavy metal mixture oxide spinel comprises a copper chromium oxide spinel.

Aspect 30: The method of aspect 28, wherein a copper salt comprises a copper hydroxide phosphate.

Aspect 31: The method of any one of aspects 23-30, wherein the reinforcing filler is provided in an amount in the range from about 5 weight % to about 60 weight % relative to the total weight of the polymer composition.

Aspect 32: The method of any one of aspects 23-30, wherein the reinforcing filler comprises a glass fiber, a mineral filler, a carbon fiber, or a combination thereof.

Aspect 33: The method of aspect 32, wherein the reinforcing filler is a glass fiber.

Aspect 34: The method of any one of aspects 23-33, wherein the laser direct structuring synergist is provided in an amount in the range from about 1 weight % to about 20 weight % relative to the total weight of the polymer composition.

Aspect 35: The method of any one of aspects 23-35, wherein the laser direct structuring synergist comprises a polycarbonate-polysiloxane copolymer, a branched polycarbonate, or Talc, or a combination thereof.

Aspect 36: The method of aspect 35, wherein the polycarbonate-polysiloxane is provided in an amount in the range of from about 5 weight % to about 20 weight % relative to the total weight of the polymer composition.

Aspect 37: The method of aspect 35, wherein the branched polycarbonate is provided in an amount in the range from about 5 weight % to about 20 weight % relative to the total weight of the polymer composition.

Aspect 38: The method of aspect 35, wherein Talc is provided in an amount in the range from about 1 weight % to about 5 weight % relative to the total weight of the polymer composition.

Aspect 39: The method of any one of aspects 23-38, further comprising one or more optional additives selected from an antioxidant, impact modifier, flame retardant, inorganic filler, and stabilizer.

Aspect 40: The method of any one of aspects 23-39, wherein the polymer composition is formed by extrusion blending.

Aspect 41: The method of any one of aspects 23-40, wherein the formed polymer composition is capable of being molded into an article.

Aspect 42: The method of any one of aspects 23-41, wherein the formed polymer composition demonstrates a flexural modulus in an amount equal or great than about 3 GPa.

Aspect 43: The method of any one of aspects 23-41, wherein the formed polymer composition demonstrates a tensile modulus in an amount equal or great than about 3 GPa.

Aspect 44: The method of any one of aspects 23-43, wherein the polymer composition is having an enhanced plating efficiency by at least about 2% relatively to a substantially identical reference composition in the absence of the laser direct structuring synergist.

Aspect 45: The method of any one of aspects 23-44, wherein the formed polymer composition is capable of having an enhanced plating efficiency in a broad window of the laser parameters.

Aspect 46: The method of any one of aspects 23-45, wherein the formed t polymer composition is capable of having a plating index value with a statistical variance of at least about 2 to about 75% lower than that measured for a substantially identical reference composition in the absence of the laser structuring synergist.

Aspect 47: The method of any one of aspects 23-46, wherein the formed polymer polymer composition is capable of having a plating index polymer value with a statistical variance of at least about 9 to about 30% lower than that measured for a substantially identical reference composition in the absence of the laser structuring synergist.

Aspect 48: An article molded from a polymer composition comprising:
a. a polycarbonate polymer;
b. a laser direct structuring additive capable of being activated by electromagnetic radiation and thereby forming elemental metal nuclei;
c. a reinforcing filler; and
d. a laser direct structuring synergist wherein the laser direct structuring synergist does not comprise a substantially linear polycarbonate; and
wherein the polymer composition is capable of being plated after being activated using a laser.

Aspect 49: The article of Aspect 48, wherein the article comprises a computer device, a household appliance, a decoration device, an electromagnetic interference device, a printed circuit, a Wi-Fi device, a Bluetooth device, a GPS device, a cellular antenna device, a smart phone device, an automotive device, a military device, an aerospace device, a medical device, a hearing aid, a sensor device, a security device, a shielding device, a RF antenna device, or a RFID device.

EXAMPLES

The following examples are put forth so as to provide those of ordinary skill in the art with a complete disclosure and description of how the methods, devices, and systems disclosed and claimed herein are made and evaluated, and are intended to be purely exemplary and are not intended to limit the disclosure. Efforts have been made to ensure accuracy with respect to numbers (e.g., amounts, temperature, etc.), but some errors and deviations should be accounted for. Unless indicated otherwise, parts are parts by weight, temperature is in degrees Celsius (° C.) or is at ambient temperature, and pressure is at or near atmospheric.
General Materials and Methods For the non-limiting Examples described herein, molded articles were prepared for analysis using representative compounding and molding profiles described in Tables 1 and 2 below. All samples were prepared by melt extrusion by feeding the pre-blend into a 37 mm Toshiba SE Twin Screw Extruder with co-rotating twin screw (37 mm) with a barrel size of 1500 mm, and a screw speed kept at about 300 rpm with the torque value maintained at about 70% and operated under standard processing conditions well known to one skilled in the art.

After extrusion, the pellets were dried at about 110° C. for a minimum time of three hours prior to molding test samples. Table 2 shows a representative molding profile for described glass filled, LDS polycarbonate composites.

TABLE 1

| Parameters | Unit | Values |
| --- | --- | --- |
| Compounder Type | NONE | TEM-37BS |
| Barrel Size | mm | 1500 |
| Die | mm | 3 |
| Free (Zone 0) Temp | ° C. | 50 |
| Zone 1 Temp | ° C. | 100 |
| Zone 2 Temp | ° C. | 150 |
| Zone 3 Temp | ° C. | 200 |
| Zone 4 Temp | ° C. | 255 |
| Zone 5 Temp | ° C. | 255 |
| Zone 6 Temp | ° C. | 255 |
| Zone 7 Temp | ° C. | 255 |
| Zone 8 Temp | ° C. | 255 |
| Zone 9 Temp | ° C. | 260 |
| Zone 10 Temp | ° C. | 260 |
| Zone 11 Temp | ° C. | 260 |
| Die Temp | ° C. | 265 |
| Screw speed | rpm | 300 |

TABLE 1-continued

| Parameters | Unit | Values |
|---|---|---|
| Throughput | kg/hr | 40 |
| Torque | % | 70 |
| Vacuum 1 | MPa | −0.08 |
| Side Feeder 1 speed | rpm | >200 |
| Melt Temperature | ° C. | 275 |

TABLE 2

| Parameters | Unit | Values |
|---|---|---|
| Cnd: Pre-drying time | Hour | 3 |
| Cnd: Pre-drying temp | ° C. | 110 |
| Molding Machine | NONE | FANUC |
| Mold Type (insert) | NONE | ASTM tensile, ASTM flexural, ASTM Izod, Colorchip |
| Hopper Temp | ° C. | 50 |
| Zone 1 Temp | ° C. | 270-280 |
| Zone 2 Temp | ° C. | 275-285 |
| Zone 3 Temp | ° C. | 280-290 |
| Nozzle Temp | ° C. | 275-285 |
| Mold Temp | ° C. | 80-120 |
| Screw speed | rpm | 100 |
| Back Pressure | kgf/cm$^2$ | 30-50 |
| Cooling time | s | 15 |
| Injection speed | mm/s | 50-150 |
| Holding pressure | kgf/cm$^2$ | 600-800 |
| Max. Injection pressure | kgf/cm$^2$ | 1000-1200 |

Heat deflection temperature was determined per ASTM D 648 with flatwise specimen orientation with specimen dimensions of 127 mm×12.7 mm×3.18 mm. Data were collected using a Ceast HDT VICAT instrument and are provided in units of ° C.

The notched Izod impact ("NII") test was carried out on 63.5 mm×12.7 mm×3.18 mm mm molded samples (bars) according to ASTM D 256 at 23° C. Test samples were conditioned in ASTM standard conditions of 23° C. and 55% relative humidity for 48 hours and then were evaluated. NII was determined using a Ceast Impact Tester.

The unnotched Izod impact test was carried out on molded parts (bars) according to ASTM D 4812 at 23° C. Test specimen was conditioned at ASTM standard conditions of 23° C. and 55% relative humidity for 48 hours and then evaluated.

Flexural properties (modulus and strength) were measured using 3.2 mm bars in accordance with ASTM D 790. Flexural strength (in units of MPa) and flexural modulus (in units of MPa) are reported at yield.

Melt volume-flow rate ("MFR") was determined according to standard ASTM D 1238 under the following test conditions: 300° C./1.2 kg load/360 sec dwell time. Data below are provided for MFR in cm$^3$/10 min.

Tensile properties (modulus, strength, and strength at yield) were measured on 3.2 mm bars in accordance with ASTM D 638. Tensile strength (for either at break or at yield, in units of MPa), tensile modulus (in units of MPa), and tensile elongation (%) are reported at break.

Surface roughness was measured using OLYMPUS LEXT OLS4000 3 D Measuring Laser Microscope under an objective lens of 20×. The scan area was set as 640 μm×640 μm, with the threshold value $\lambda_c$ set as 125 μm. Areal roughness parameter ($S_a$) was provided to indicate the surface roughness over the scan area. For each specimen, the surface roughness was measured at the three different regions and the mean value was reported.

Laser Direct Structuring Formulations Comprising Heavy Metal Mixture Oxide Spinel as LDS Additive and Plating Efficiency Enhancing Additives For the non-limiting Examples described herein below, sample compositions were prepared from the components described in Table 3 below. The performance of the composites of glass filled polycarbonate with the black copper chromium oxide spinel (CuCrO) LDS additive was tested with and without addition of the laser direct structuring (LDS) synergist additive. The composites described herein were prepared accordingly to the compounding and molding profiles described above. The formulation compositions (labeled as "Example 1," "Example 2," and the like) and various comparator samples (labeled as "Control 1," "Control 2," and the like) are further described herein and in Table 3.

Three compositions were prepared each containing 6 wt. % of a standard copper chromium oxide spine LDS additive. The 20 mole % PC-Siloxane copolymer (EXL), a LDS synergist additive was added to the sample labeled Example 1, while Talc, a LDS synergist additive was added to the sample labeled Example 2. Table 4 shows performance comparison of all three formulations.

TABLE 3

| Formulation | Control 1 | Example 1 | Example 2 |
|---|---|---|---|
| 100 Grade PCP (wt %) | 37.8 | 35.3 | 38 |
| PCP 1300 (wt %) | 20.5 | 18 | 19.3 |
| 20% PC-siloxane copolymer, PCP endcapped (EXL) (wt %) | 0 | 5 | 0 |
| Phosphite stabilizer (wt %) (Trade name: Irgafos ®168) | 0.1 | 0.1 | 0.1 |
| 8 Pentaerythritol tetrastearate (wt %) | 0.5 | 0.5 | 0.5 |
| Hindered Phenol Anti-Oxidant (wt %) | 0.1 | 0.1 | 0.1 |
| Shepherd Black 1 G LDS Additive (wt %) | 6 | 6 | 6 |
| Acrylic Polymer Impact Modifier (wt %) | 5 | 5 | 5 |
| Fine Talc (wt %) | 0 | 0 | 1 |
| Nittobo CSG 3 PA-830 flat fiber (wt %) | 30 | 30 | 30 |

TABLE 4

| Test Detail | Test description | Unit | Control 1 | Example 1 | Example 2 |
|---|---|---|---|---|---|
| MFR | ASTM D1238 | cm$^3$/10 min | 10.7 | 9.76 | 16.3 |
| HDT | ASTM D648 | ° C. | 136 | 137 | 135 |
| Flexural Modulus | ASTM D790 | MPa | 6410 | 6250 | 6600 |
| Flexural Strength | ASTM D790 | MPa | 141 | 135 | 140 |
| Tensile Modulus | ASTM D638 | MPa | 8124.6 | 7992 | 8514.4 |
| Tensile Strength | ASTM D 638 | MPa | 92.2 | 88.9 | 94.5 |
| Tensile Elongation | ASTM D 638 | % | 2 | 2 | 2 |
| Notched IZOD | ASTM D256 | J/m | 86.3 | 101 | 75.3 |
| Unnotched IZOD | ASTM D 4812 | J/m | 487 | 494 | 517 |
| Plating Index | | | 1.1 | 1.4 | 1.3 |

A comparison of the plating efficiency, as measured by a plating index for a distinct set of laser parameters is shown in Table 5.

The Plating Index is calculated as follows:

$$\text{Plating Index} = \frac{\text{Average Cu thickness at a given parameter}}{\text{Average Cu thickness for reference sample at the same parameter}}$$

The results indicate that addition of plating efficiency enhancing additives such as EXL and Talc led to the higher plating efficiency measured at all laser parameters.

TABLE 5

| Power, W | Frequency, kHz | Speed, m/s | Control 1 | Example 1 | Example 2 |
|---|---|---|---|---|---|
| 10 | 100 | 2 | 1.0 | 1.4 | 1.1 |
| 10 | 70 | 2 | 1.0 | 1.5 | 1.2 |
| 10 | 40 | 2 | 1.1 | 1.5 | 1.3 |
| 2 | 100 | 2 | 1.2 | 1.4 | 1.4 |
| 2 | 70 | 2 | 1.2 | 1.4 | 1.5 |
| 2 | 40 | 2 | 1.3 | 1.5 | 1.5 |
| 7 | 80 | 4 | 1.2 | 1.4 | 1.4 |
| 5 | 80 | 4 | 1.3 | 1.5 | 1.5 |
| 3 | 80 | 4 | 1.2 | 1.5 | 1.4 |
| 3 | 100 | 2 | 1.2 | 1.4 | 1.3 |
| 3 | 70 | 2 | 1.2 | 1.4 | 1.4 |
| 3 | 40 | 2 | 1.2 | 1.4 | 1.4 |
| 5 | 100 | 4 | 1.2 | 1.4 | 1.4 |
| 3 | 100 | 4 | 1.2 | 1.4 | 1.4 |
| 9 | 80 | 4 | 1.2 | 1.4 | 1.3 |
| 5 | 100 | 2 | 1.0 | 1.3 | 1.2 |
| 5 | 70 | 2 | 1.1 | 1.3 | 1.3 |
| 5 | 40 | 2 | 1.1 | 1.4 | 1.3 |
| 11 | 100 | 4 | 1.1 | 1.3 | 1.2 |
| 9 | 100 | 4 | 1.2 | 1.4 | 1.2 |
| 7 | 100 | 4 | 1.2 | 1.4 | 1.2 |
| 8 | 100 | 2 | 0.9 | 1.2 | 1.0 |
| 8 | 70 | 2 | 1.0 | 1.2 | 1.1 |
| 8 | 40 | 2 | 1.1 | 1.3 | 1.3 |

The measured plating index values were plotted to further compare the effect of the additives on a plating efficiency enhancement of LDS polycarbonate composites and shown in FIG. 1. FIG. 1 includes boxplots of a plating index measured for 30 wt. % glass filled, 6 wt. % CuCrO, as LDS additive, with and without LSD synergist additives. Solid circles indicate the plating index mean values. FIG. 1 demonstrates increase in a mean value with the addition of the plating efficiency enhancing additives.

Figure 2:
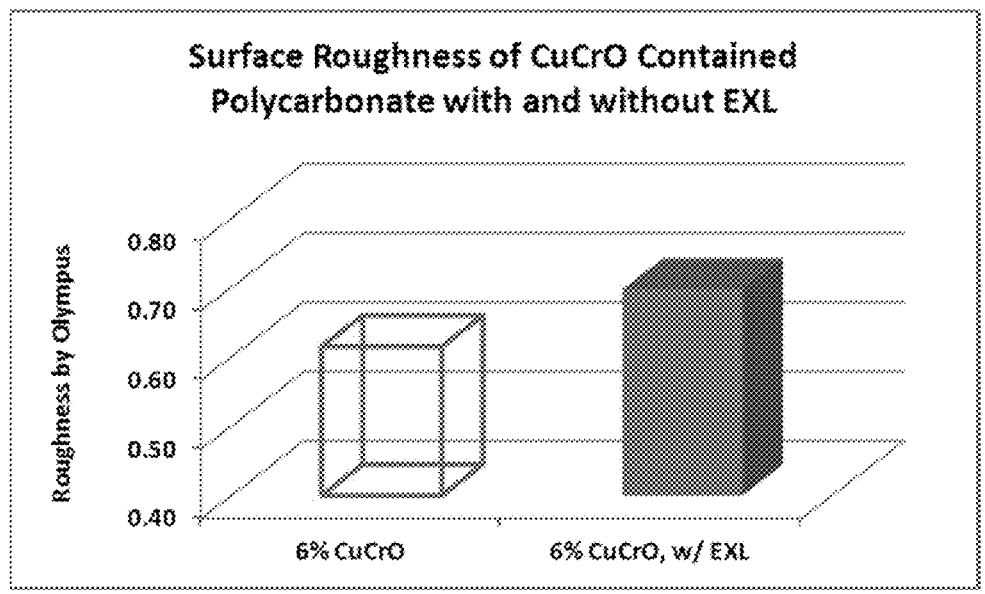
FIG. 2 shows the representative surface roughness for representative disclosed LDS polycarbonate composites with and without a laser direct structuring synergist, wherein the representative laser direct structuring synergist is polysiloxane-polycarbonate copolymer (EXL).
Figure 3:
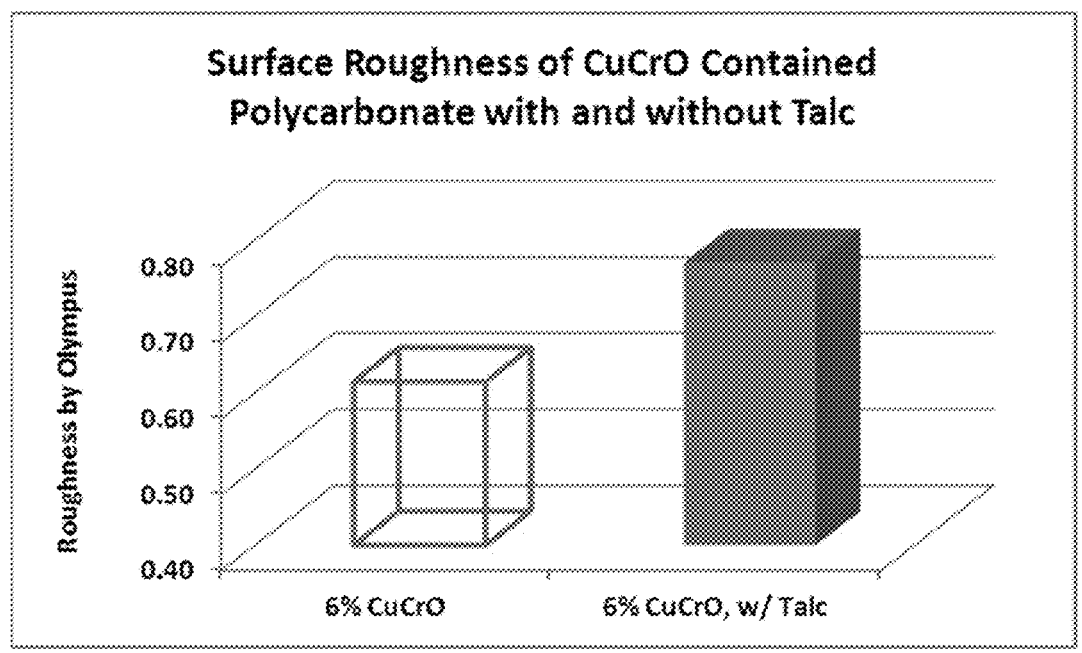
FIG. 3 shows the representative surface roughness for representative disclosed LDS polycarbonate composites with and without a laser direct structuring synergist, wherein the representative laser direct structuring synergist is Talc.

In order to understand the plating enhancement mechanism, the material roughness was measured using OLYMPUS LEXT OLS4000 3D Measuring Laser Microscope. FIG. 2 and FIG. 3 show representative surface roughness for representative disclosed LDS polycarbonate composites with and without the LDS synergist additive, wherein representative disclosed additives are polycarbonate-siloxane copolymer (EXL) 2) and Talc (FIG. 3). The results indicated that with addition of both EXL and Talc, the material surface roughness increased.

Laser Direct Structuring Formulations Comprising Copper Salt as LDS Additive and Plating Efficiency Enhancing Additives For the non-limiting Examples described herein below, sample compositions were prepared from the components described in Table 6 below. The performance of the composites of glass filled polycarbonate with the copper hydroxide phosphate ($Cu_2OHPO_4$) LDS additive was tested with and without addition of the LDS synergist additives. The composites described herein were prepared accordingly to the compounding and molding profiles described in Tables 1 and 2.

Three compositions were prepared each containing 3 wt. % of a copper hydroxide phosphate ($Cu_2OHPO_4$) (Trade name: Lazerflair®8840) LDS additive. The 20 mole % PC-Siloxane copolymer (EXL), a LDS synergist additive, was added to the sample labeled Example 3, while Talc, a LDS synergist additive, was added to the sample labeled Example 4. The sample with no LDS synergist additive is labeled as Control 2. Table 7 shows performance comparison of all three formulations.

TABLE 6

| Formulation | Control 2 | Example 3 | Example 4 |
|---|---|---|---|
| Sebacic Acid/BPA/PCP polyestercarbonate (wt %) | 17.4 | 16.4 | 17.4 |
| Sebacic Acid/BPA Copolymer | 43.79 | 39.79 | 42.79 |
| 20% PC-siloxane copolymer, PCP endcapped (EXL) (wt %) | 0 | 5 | 0 |
| Phosphite stabilizer (wt %) (Trade name: Irgafos ®168) | 0.1 | 0.1 | 0.1 |
| 8 Pentaerythritol tetrastearate (wt %) | 0.5 | 0.5 | 0.5 |
| Hindered Phenol Anti-Oxidant (wt %) | 0.1 | 0.1 | 0.1 |
| Epoxy (wt %) | 0.1 | 0.1 | 0.1 |
| Phosphorous Acid (wt %) | 0.01 | 0.01 | 0.01 |
| Acrylic Polymer Impact Modifier (wt %) | 5 | 5 | 5 |
| Lazerflair ®8840 | 3 | 3 | 3 |
| Fine Talc (wt %) | 0 | 0 | 1 |
| Nittobo CSG 3 PA-830 flat fiber (wt %) | 30 | 30 | 30 |

TABLE 7

| Test Detail | Test description | Unit | Control 2 | Example 3 | Example 4 |
|---|---|---|---|---|---|
| MFR | ASTM D 1238 | cm³/10 min | 19 | 22 | 19.4 |
| HDT | ASTM D 648 | ° C. | 126 | 125 | 125 |
| Flexural Modulus | ASTM D 790 | MPa | 7410 | 6490 | 7650 |
| Flexural Strength | ASTM D 790 | MPa | 173 | 156 | 172 |
| Tensile Modulus | ASTM D 638 | MPa | 8705.4 | 8525.2 | 8790.6 |
| Tensile Strength | ASTM D 638 | MPa | 112 | 110 | 111.2 |
| Tensile Elongation | ASTM D 638 | % | 2.4 | 2.4 | 2.4 |
| Notched IZOD | ASTM D 256 | J/m | 159 | 152 | 124 |
| Unnotched IZOD | ASTM D 4812 | J/m | 708 | 568 | 679 |
| Plating Index | | | 0.7 | 0.8 | 0.8 |

A comparison of the plating efficiency, as measured by a plating index for a distinct set of laser parameters is shown in Table 8.

It should be noted that a standard plating index of ≥0.7 is recommended in order to achieve good laser direct structuring processing. The results with the plating index values lower than about 0.7 are shown in Table 8. These results indicated that when 3 wt. % $Cu_2OHPO_4$ was used as a LDS additive, the plating index values measured in Control 2 for some laser parameters were lower than 0.7. The addition of EXL and/or Talc as the LDS synergist additives, improved the measured plating index values.

TABLE 8

| Power, W | Frequency, kHz | Speed, m/s | Control 2 | Example 3 | Example 4 |
|---|---|---|---|---|---|
| 10 | 100 | 2 | 1.0 | 1.1 | 1.0 |
| 10 | 70 | 2 | 1.1 | 1.1 | 1.0 |
| 10 | 40 | 2 | 1.2 | 1.2 | 1.1 |
| 2 | 100 | 2 | 0.0 | 0.1 | 0.0 |
| 2 | 70 | 2 | 0.1 | 0.4 | 0.3 |
| 2 | 40 | 2 | 0.5 | 0.8 | 0.7 |
| 7 | 80 | 4 | 0.8 | 1.0 | 0.9 |
| 5 | 80 | 4 | 0.6 | 0.7 | 0.6 |
| 3 | 80 | 4 | 0.0 | 0.1 | 0.1 |
| 3 | 100 | 2 | 0.1 | 0.4 | 0.2 |
| 3 | 70 | 2 | 0.5 | 0.9 | 0.7 |
| 3 | 40 | 2 | 0.8 | 1.1 | 1.0 |
| 5 | 100 | 4 | 0.2 | 0.4 | 0.3 |
| 3 | 100 | 4 | 0.0 | 0.0 | 0.0 |
| 9 | 80 | 4 | 1.0 | 1.2 | 1.0 |
| 5 | 100 | 2 | 0.9 | 1.1 | 1.0 |
| 5 | 70 | 2 | 1.0 | 1.2 | 1.0 |
| 5 | 40 | 2 | 1.1 | 1.2 | 1.1 |
| 11 | 100 | 4 | 1.0 | 1.1 | 1.1 |
| 9 | 100 | 4 | 1.0 | 1.0 | 1.0 |
| 7 | 100 | 4 | 0.7 | 0.8 | 0.8 |
| 8 | 100 | 2 | 1.0 | 1.1 | 1.0 |
| 8 | 70 | 2 | 1.0 | 1.1 | 1.1 |
| 8 | 40 | 2 | 1.0 | 1.1 | 1.1 |

Effect of Various Plating Efficiency Enhancing Additives and their Concentration on Performance of Laser Direct Structuring Formulations Comprising Copper Salt as LDS Additive For the non-limiting Examples described herein below, sample compositions were prepared from the components described in Table 9 below. The performance of the composites of glass filled polycarbonate with the copper hydroxide phosphate ($Cu_2OHPO_4$) LDS additive was tested with and without addition of the LDS synergist additives. The composites described herein were prepared accordingly to the compounding and molding profiles described in Tables 1 and 2.

Three compositions were prepared each containing 3 wt. % of a copper hydroxide phosphate ($Cu_2OHPO_4$) (Trade name: Lazerflair®8840) LDS additive. The 20 mole % PC-Siloxane copolymer (EXL), a LDS synergist additive, was added to the sample labeled Example 5, while branched polycarbonate (CFR), a LDS synergist additive, was added to the sample labeled Example 6. The sample with no plating efficiency enhancing additives is labeled as Control 3. Table 10 shows a performance comparison of all three formulations.

TABLE 9

| Formulation | Control 3 | Example 5 | Example 6 |
|---|---|---|---|
| Sebacic Acid/BPA/PCP polyestercarbonate (wt %) | 17.3 | 14 | 12.8 |
| Sebacic Acid/BPA Copolymer (wt %) | 43.69 | 36.99 | 33.10 |
| Branched THPE, HBN Endcapped PC (CFR) (wt %) | 0 | 0 | 15 |
| 20% PC-siloxane copolymer, PCP endcapped (EXL) (wt %) | 0 | 10 | 0 |
| Phosphite stabilizer (wt %) (Trade name: Irgafos®168) | 0.1 | 0.1 | 0.1 |
| 8 Pentaerythritol tetrastearate (wt %) | 0.5 | 0.5 | 0.5 |
| Hindered Phenol Anti-Oxidant (wt %) | 0.1 | 0.1 | 0.1 |
| Epoxy (wt %) | 0.1 | 0.1 | 0.1 |
| Mono Zinc Phosphate (wt %) | 0.2 | 0.2 | 0.2 |
| Phosphorous Acid (wt %) | 0.01 | 0.01 | 0.01 |
| Acrylic Polymer Impact Modifier (wt %) | 5 | 5 | 5 |

TABLE 9-continued

| Formulation | Control 3 | Example 5 | Example 6 |
|---|---|---|---|
| Lazerflair ®8840 | 3 | 3 | 3 |
| Fine Talc (wt %) | 0 | 0 | 1 |
| Nittobo CSG 3 PA-830 flat fiber (wt %) | 30 | 30 | 30 |

TABLE 10

| Test Detail | Test description | Unit | Control 3 | Example 5 | Example 6 |
|---|---|---|---|---|---|
| MFR | ASTM D 1238 | $cm^3$/10 min | 16.2 | 17.8 | 14.9 |
| HDT | ASTM D 648 | °C. | 127 | 127 | 129 |
| Flexural Modulus | ASTM D 790 | MPa | 6870 | 6470 | 7470 |
| Flexural Strength | ASTM D 790 | MPa | 157 | 153 | 178 |
| Tensile Modulus | ASTM D 638 | MPa | 8709.2 | 8659.8 | 8914.4 |
| Tensile Strength | ASTM D 638 | MPa | 109.4 | 106 | 114.4 |
| Tensile Elongation | ASTM D 638 | % | 2.3 | 2.4 | 2.3 |
| Notched IZOD | ASTM D 256 | J/m | 150 | 152 | 151 |
| Unnotched IZOD | ASTM D 4812 | J/m | 682 | 529 | 677 |
| Plating Index | | | 0.72 | 0.76 | 0.76 |

A comparison of the plating efficiency, as measured by a plating index for a distinct set of laser parameters is shown in Table 11. Since the plating index values that largely accepted by LDS industry are higher or at about 0.7, the values lower than about 0.7 are marked in Table 11 (with an asterisk "*"). This results indicate that when 3 wt. % $Cu_2OHPO_4$ was used as a LDS additive, the plating index values measured in Control 3 for some laser parameters were lower than 0.7. The addition of EXL and/or CFR as LDS synergist additives, improved the measured plating index values, wherein samples comprising CFR as a LDS synergist additive demonstrated higher plating index values for a larger number of the laser parameters.

TABLE 11

| Power, W | Frequency, kHz | Speed, m/s | Control 3 | Example 5 | Example 6 |
|---|---|---|---|---|---|
| 10 | 100 | 2 | 0.7 | 0.8 | 0.9 |
| 10 | 70 | 2 | 0.8 | 1.0 | 1.0 |
| 10 | 40 | 2 | 0.9 | 0.9 | 1.0 |
| 2 | 100 | 2 | 0.0* | 0.2* | 1.0 |
| 2 | 70 | 2 | 0.2* | 0.4* | 0.0* |
| 2 | 40 | 2 | 0.6* | 0.8 | 0.8 |
| 7 | 80 | 4 | 0.9 | 1.0 | 0.9 |
| 5 | 80 | 4 | 0.6* | 0.9 | 0.8 |
| 3 | 80 | 4 | 0.1* | 0.2* | 0.2* |
| 3 | 100 | 2 | 0.3* | 0.5* | 0.3* |
| 3 | 70 | 2 | 0.7 | 0.8 | 0.7 |
| 3 | 40 | 2 | 0.9 | 0.9 | 0.9 |
| 5 | 100 | 4 | 0.5* | 0.7 | 0.6 |
| 3 | 100 | 4 | 0.0* | 0.1* | 0.0* |
| 9 | 80 | 4 | 0.9 | 1.0 | 1.0 |
| 5 | 100 | 2 | 1.0 | 0.9 | 0.9 |
| 5 | 70 | 2 | 1.2 | 0.9 | 0.9 |
| 5 | 40 | 2 | 1.1 | 0.9 | 0.9 |
| 11 | 100 | 4 | 0.9 | 1.0 | 0.9 |
| 9 | 100 | 4 | 0.8 | 1.9 | 0.9 |
| 7 | 100 | 4 | 0.8 | 0.9 | 0.9 |

TABLE 11-continued

| Power, W | Frequency, kHz | Speed, m/s | Control 3 | Example 5 | Example 6 |
|---|---|---|---|---|---|
| 8 | 100 | 2 | 0.9 | 0.9 | 0.9 |
| 8 | 70 | 2 | 1.3 | 0.9 | 0.9 |
| 8 | 40 | 2 | 1.0 | 0.9 | 0.9 |

Figure 4:
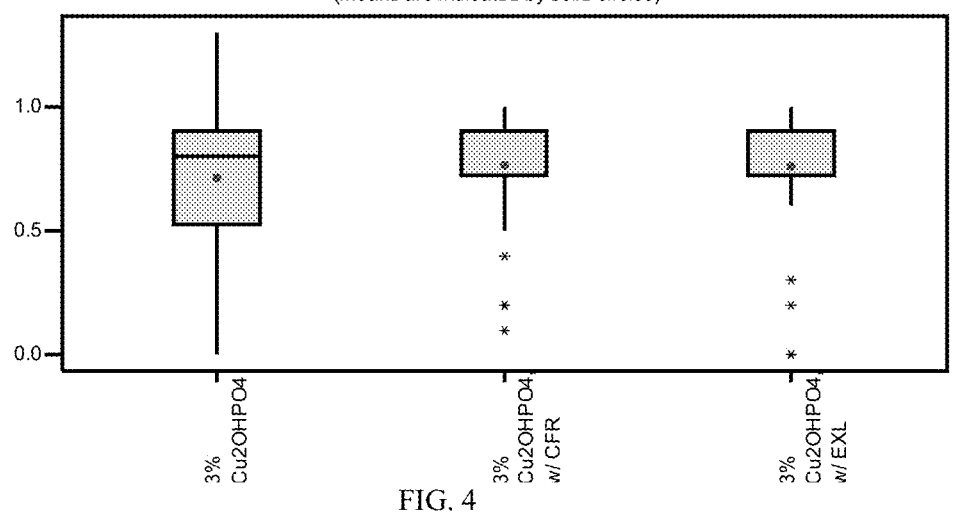
FIG. 4 shows the representative plating index values measured for representative disclosed LDS polycarbonate composites with and without a laser direct structuring synergist, wherein the representative laser direct structuring synergists are polysiloxane-polycarbonate copolymer (EXL) and branched polycarbonate (CFR). Solid circles indicate the mean plating index values.

The measured plating index values were plotted to compare an effect of the additives on a plating efficiency enhancement of LDS polycarbonate composites and shown in FIG. 4. FIG. 4 includes boxplots of a plating index measured for 30 wt. % glass filled, 3 wt. % $Cu_2OHPO_4$, as LDS additive, with and without LDS synergist additives. Solid circles indicate the plating index mean values. FIG. 4 demonstrates no significant increase in a mean value with the addition of the LDS synergist additives. However, as indicated by the box length, the variance in a plating index decreased with the addition of the plating efficiency enhancing additives. A smaller variance in plating indexes measured at various laser parameters allowed the use of broader laser window in LDS applications.

It will be apparent to those skilled in the art that various modifications and variations can be made in the present invention without departing from the scope or spirit of the invention. Other aspects of the invention will be apparent to those skilled in the art from consideration of the specification and practice of the invention disclosed herein. It is intended that the specification and examples be considered as exemplary only, with a true scope and spirit of the invention being indicated by the following claims.

The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A polymer composition comprising:
    a. from about 20% by weight to about 84% by weight of a polycarbonate polymer;
    b. from about 1% by weight to about 10% by weight of a laser direct structuring additive capable of being activated by electromagnetic radiation to form an elemental metal nuclei;
    c. from about 10% by weight to about 50% by weight of a reinforcing filler; and
    d. from about 5% by weight to about 20% by weight of a laser direct structuring synergist comprising a polycarbonate-polysiloxane copolymer, a branched polycarbonate, or a combination thereof, and
    wherein
        the polymer composition has an enhanced laser plating efficiency of at least 10% relative to a substantially identical reference composition in the absence of the laser direct structuring synergist,
        a molded article formed from the polymer composition has a notched Izod impact energy at 23° C. of from about 100 J/m to about 165 J/m,
        the polymer composition is capable of being plated after being activated using a laser, and
        weight percentages are relative to total weight of the polymer composition.

2. The polymer composition of claim 1, wherein the laser direct structuring additive comprises a heavy metal mixture oxide spinel, a copper salt, or a combination thereof.

3. The polymer composition of claim 2, wherein the heavy metal mixture oxide spinel comprises a copper chromium oxide spinel.

4. The polymer composition of claim 2, wherein the copper salt comprises a copper hydroxide phosphate.

5. The polymer composition of claim 1, wherein the reinforcing filler comprises a glass fiber, a mineral filler, a carbon fiber, or a combination thereof.

6. The polymer composition of claim 1, further comprising talc in an amount from about 1% by weight to about 5% by weight relative to the total weight of the polymer composition.

7. The polymer composition of claim 1, further comprising one or more additional additives comprising an antioxidant, an impact modifier, a flame retardant, an inorganic filler, a stabilizer, or a combination thereof.

8. The polymer composition of claim 1, wherein the polymer composition is capable of being molded into an article.

9. The polymer composition of claim 1, wherein the polymer composition demonstrates a flexural modulus in an amount equal to or greater than about 3 GPa.

10. The polymer composition of claim 1, wherein the polymer composition demonstrates a tensile modulus in an amount equal to or greater than about 3 GPa.

11. The polymer composition of claim 1, wherein the polymer composition is capable of having a plating index value with a statistical variance of at least about 2 to about 75% lower than that measured for a substantially identical reference composition in the absence of the laser direct structuring synergist.

12. The polymer composition of claim 1, wherein the polymer composition is capable of having a plating index value with a statistical variance of at least about 9 to about 30% lower than that measured for a substantially identical reference composition in the absence of the laser direct structuring synergist.

13. A method for making a molded article, comprising:
    1. forming a blend composition comprising
        a. from about 20% by weight to about 84% by weight of a polycarbonate polymer,
        b. from about 1% by weight to about 10% by weight of a laser direct structuring additive capable of being activated by electromagnetic radiation to form an elemental metal nuclei,
        c. from about 10% by weight to about 50% by weight of a reinforcing filler, and
        d. from about 5% by weight to about 20% by weight of a laser direct structuring synergist comprising a polycarbonate-polysiloxane copolymer, a branched polycarbonate, or a combination thereof,
    2. forming the molded article from the blend composition; and
    3. subjecting the molded article to a laser direct structuring process,
    wherein
        the polymer composition has an enhanced laser plating efficiency of at least 10% relative to a substantially identical reference composition in the absence of the laser direct structuring synergist,
        the molded article has a notched Izod impact energy at 23° C. of from about 100 J/m to about 165 J/m,
        the polymer composition is capable of being plated after being activated using a laser, and weight percentages are relative to total weight of the polymer composition.

14. The method of claim 13, wherein the polycarbonate polymer comprises a bisphenol A polycarbonate polymer.

15. The method of claim 14, wherein the bisphenol A polycarbonate polymer comprises a blend of at least two different bisphenol A polycarbonates.

16. The method of claim 13, wherein the laser direct structuring additive comprises a heavy metal mixture oxide spinel, a copper salt, or a combination thereof.

17. The method of claim 13, wherein the reinforcing filler comprises a glass fiber, a mineral filler, a carbon fiber, or a combination thereof.

18. The method of claim 13, wherein the blend composition demonstrates a flexural modulus in an amount equal to or greater than about 3 GPa.

19. The method of claim 13, wherein the blend composition demonstrates a tensile modulus in an amount equal to or greater than about 3 GPa.

20. The method of claim 13, wherein the blend composition is capable of having a plating index value with a statistical variance of at least about 2 to about 75% lower than that measured for a substantially identical reference composition in the absence of the laser direct structuring synergist.

21. The method of claim 13, wherein the blend composition is capable of having a plating index value with a statistical variance of at least about 9 to about 30% lower than that measured for a substantially identical reference composition in the absence of the laser direct structuring synergist.

22. An article molded from a polymer composition comprising:
   a. from about 20% by weight to about 84% by weight of a polycarbonate polymer;
   b. from about 1% by weight to about 10% by weight of a laser direct structuring additive capable of being activated by electromagnetic radiation to form an elemental metal nuclei;
   c. from about 10% by weight to about 50% by weight of a reinforcing filler; and
   d. from about 5% by weight to about 20% by weight of a laser direct structuring synergist comprising a polycarbonate-polysiloxane copolymer, a branched polycarbonate, or a combination thereof; and wherein
   the article has an enhanced laser plating efficiency of at least 10% relative to a substantially identical article in the absence of the laser direct structuring synergist,
   the article has a notched Izod impact energy at 23° C. of from about 100 J/m to about 165 J/m,
   the article is capable of being plated after being activated using a laser, and
   weight percentages are relative to total weight of the polymer composition.

23. The article of claim 22, wherein the article comprises a computer device, a household appliance, a decoration device, an electromagnetic interference device, a printed circuit, a Wi-Fi device, a Bluetooth device, a GPS device, a cellular antenna device, a smart phone device, an automotive device, a military device, an aerospace device, a medical device, a hearing aid, a sensor device, a security device, a shielding device, an RF antenna device, or an RFID device.

24. The polymer composition of claim 1, wherein the polymer composition has an enhanced laser plating efficiency of at least 20% relative to a substantially identical reference composition in the absence of the laser direct structuring synergist.

25. The polymer composition of claim 1, wherein the polymer composition has an enhanced laser plating efficiency of at least 30% relative to a substantially identical reference composition in the absence of the laser direct structuring synergist.

26. The method of claim 13, wherein the polymer composition has an enhanced laser plating efficiency of at least 20% relative to a substantially identical reference composition in the absence of the laser direct structuring synergist.

27. The method of claim 13, wherein the polymer composition has an enhanced laser plating efficiency of at least 30% relative to a substantially identical reference composition in the absence of the laser direct structuring synergist.

28. The article of claim 22, further comprising a laser-activated conductive path, wherein the laser-activated conductive path is formed by activation with a laser.

29. The article of claim 28, further comprising a metal layer plated onto the laser-activated conductive path.

* * * * *